United States Patent
Tabery et al.

(10) Patent No.: US 12,169,366 B2
(45) Date of Patent: Dec. 17, 2024

(54) VOLTAGE CONTRAST METROLOGY MARK

(71) Applicant: ASML Netherlands B.V., Veldhoven (NL)

(72) Inventors: Cyrus Emil Tabery, San Jose, CA (US); Simon Hendrik Celine Van Gorp, Oud-Turnhout (BE); Simon Philip Spencer Hastings, San Jose, CA (US); Brennan Peterson, Longmont, CO (US)

(73) Assignee: ASML Netherlands B.V., Veldhoven (NL)

( * ) Notice: Subject to any disclaimer, the term of this patent is extended or adjusted under 35 U.S.C. 154(b) by 169 days.

(21) Appl. No.: 16/772,022

(22) PCT Filed: Dec. 7, 2018

(86) PCT No.: PCT/EP2018/083994
§ 371 (c)(1),
(2) Date: Jun. 11, 2020

(87) PCT Pub. No.: WO2019/115391
PCT Pub. Date: Jun. 20, 2019

(65) Prior Publication Data
US 2021/0088917 A1  Mar. 25, 2021

Related U.S. Application Data

(60) Provisional application No. 62/727,925, filed on Sep. 6, 2018, provisional application No. 62/597,933, filed
(Continued)

(51) Int. Cl.
G03F 7/00 (2006.01)
H01L 21/66 (2006.01)
H01L 23/544 (2006.01)

(52) U.S. Cl.
CPC ...... *G03F 7/70683* (2013.01); *G03F 7/70625* (2013.01); *G03F 7/70633* (2013.01);
(Continued)

(58) Field of Classification Search
CPC ............. G03F 7/70683; G03F 7/70625; G03F 7/70633; G03F 7/70658
See application file for complete search history.

(56) References Cited

U.S. PATENT DOCUMENTS 5,959,459 A  9/1999 Satya et al.
6,236,222 B1  5/2001 Sur, Jr. et al.
(Continued)

FOREIGN PATENT DOCUMENTS

KR   20090001052 A   1/2009

OTHER PUBLICATIONS

Notification of Reason(s) for Refusal issued in related Korean Patent Application No. 10-2020-7016788; mailed Jan. 10, 2022 (14 pgs.).
(Continued)

*Primary Examiner* — Steven H Whitesell
(74) *Attorney, Agent, or Firm* — Finnegan, Henderson, Farabow, Garrett & Dunner, LLP

(57) ABSTRACT

A measurement mark is disclosed. According to certain embodiments, the measurement mark includes a set of first test structures developed in a first layer on a substrate, each of the set of first test structures comprising a plurality of first features made of first conducting material. The measurement mark also includes a set of second test structures developed in a second layer adjacent to the first layer, each of the set of second test structures comprising a plurality of second features made of second conducting material. The measurement mark is configured to indicate connectivity between the set of first test structures and associated second test
(Continued)

structures in the set of second test structures when imaged using a voltage-contrast imaging method.

18 Claims, 10 Drawing Sheets

Related U.S. Application Data on Dec. 12, 2017, provisional application No. 62/597,413, filed on Dec. 11, 2017.

(52) U.S. Cl.
CPC ............ *H01L 22/32* (2013.01); *H01L 23/544* (2013.01); *H01L 2223/54426* (2013.01)

(56) References Cited

U.S. PATENT DOCUMENTS

| | | | |
|---|---|---|---|
| 6,737,658 | B1 | 5/2004 | Nakasugi et al. |
| 6,818,364 | B2 | 11/2004 | Nakasugi |
| 7,171,035 | B2 | 1/2007 | Guldi et al. |
| 2004/0084671 | A1 | 5/2004 | Song et al. |
| 2004/0169861 | A1* | 9/2004 | Mieher ............... G03F 7/70625 |
| | | | 356/400 |
| 2007/0111342 | A1* | 5/2007 | Satya .................. H01L 23/5226 |
| | | | 257/E23.145 |
| 2013/0147066 | A1* | 6/2013 | Cheng .................... H01L 22/12 |
| | | | 257/E21.546 |
| 2017/0047197 | A1 | 2/2017 | Hotta et al. |
| 2019/0101835 | A1* | 4/2019 | Chen ................... G03F 7/70683 |

OTHER PUBLICATIONS

First Office Action issued in related Chinese Patent Application No. 201880079555.6; mailed Apr. 24, 2022 (11 pgs.).

International Search Report and Written Opinion issues by the International Searching Authority in related PCT Application No. PCT/EP2018/083994, dated Apr. 9, 2019 (9 pgs.).

Coane et al., "Voltage Contrast Registration Marks for Electron Beam Lithography [NPL / EPO]", IP.com PriorArtDatabase IPCOM000064251D, TDB 06-85 p. 323-326, Jun. 1, 1985.

Nakasugi et al., "Alignment system using voltage contrast images for low-energy electron-beam lithography [NPL / EPO]", J. Vac. Sci. Technol. B 19(6), pp. 2869-2873, DOI: 10.1116/1.1421544 © American Vacuum Society, Oct. 2001.

Patterson, et al., "Voltage Contrast Test Structure for Measurement of Mask Misalignment [NPL / EPO]" ASMC 2010, pp. 334-340.

Sprogis, "An Overlay Vernier and Process Bias Monitor Measured by Voltage Contrast SEM," Proc. IEEE 1989 Int. Conference on Microelectronic Test Structures, vol. 2, No. 1, Mar. 1989, pp. 129-131.

\* cited by examiner

VOLTAGE CONTRAST METROLOGY MARK

CROSS-REFERENCE TO RELATED APPLICATIONS

This application is a national stage filing under 35 U.S.C. § 371 of International Application No. PCT/EP2018/083994, filed Dec. 7, 2018, and published as WO 2019/115391 A1, which claims priority of U.S. application No. 62/597,413 which was filed on Dec. 11, 2017, U.S. application No. 62/597,933 which was filed on Dec. 12, 2017, and U.S. application No. 62/727,925 which was filed on Sep. 6, 2018. The contents of these applications are each incorporated herein by reference in their entireties.

TECHNICAL FIELD

The present disclosure generally relates to overlay metrology during semiconductor device fabrication, and more particularly, to a metrology mark used to measure alignment error of two layers and critical dimensions based on voltage contrast.

BACKGROUND

A lithographic apparatus is a machine that applies a desired pattern onto a substrate, usually onto a target portion of the substrate. A lithographic apparatus may be used, for example, in the manufacture of integrated circuits (ICs). In that instance, a patterning device, which is alternatively referred to as a mask or a reticle, may be used to generate a circuit pattern to be formed on an individual layer of the IC. This pattern may be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti parallel to this direction. It is also possible to transfer the pattern from the patterning device to the substrate by imprinting the pattern onto the substrate.

In lithographic processes, it is desirable to frequently make measurements of the structures created, e.g., for process control and verification. One or more parameters of the structures are typically measured or determined, for example the overlay error between successive layers formed in or on the substrate. There are various metrology techniques for making measurements of the microscopic structures formed in a lithographic process. An example of such a tool is an optical scatterometer developed for use in the lithographic field. This device directs a beam of radiation onto a target on the surface of the substrate and measures one or more properties of the redirected radiation—e.g., intensity at a single angle of reflection as a function of wavelength; intensity at one or more wavelengths as a function of reflected angle; or polarization as a function of reflected angle—to obtain a set of data from which a property of interest of the target may be determined. Determination of the property of interest may be performed by various techniques, such as reconstruction of the target structure by iterative approaches such as rigorous coupled wave analysis or finite element methods, library searches, and principal component.

However, as the physical sizes of IC components continue to reduce down to a sub-100 or even sub-10 nanometers, the optical scatterometer gradually becomes incompetent because its resolution is limited by the wavelength of light. Due to this discrepancy of optical resolution and device dimension, i.e., due to the optical test structure having a different pitch than the device structure, a non-zero offset needs to be applied to the measurement results. Often, the non-zero offset has to be estimated based manual calibration measurement or using other complex methods.

SUMMARY

Embodiments of the present disclosure relate to voltage contrast metrology marks. In some embodiments, a measurement mark is provided. The measurement mark includes a set of first test structures developed in a first layer on a substrate, each of the set of first test structures comprising a plurality of first features made of first conducting material. The measurement mark also includes a set of second test structures developed in a second layer adjacent to the first layer, each of the set of second test structures comprising a plurality of second features made of second conducting material. The measurement mark is configured to indicate connectivity between the set of first test structures and associated second test structures in the set of second test structures when imaged using a voltage-contrast imaging method.

In some embodiments, a measurement mark is provided. The measurement mark includes a first array of first features at a first pitch and a second array of second features at a second pitch, the first array and the second array being arranged in two consecutive layers on a substrate. The measurement mark is configured for determining an overlay value between the first features relative to associated second features or is configured for determining a critical dimension value of the first features or the second features when imaged using a voltage-contrast imaging method.

In some embodiments, a system is provided. The system includes a particle beam tool for scanning a measurement mark and for detecting scattered electrons from the measurement mark. The system also includes a controller coupled with the particle beam tool. The controller includes circuitry to: generate a voltage-contrast image from the detected scattered electrons; and determine an overlay value or critical dimension value from the generated voltage-contrast image.

In some embodiments, a method is provided. The method includes scanning a set of first test structures of a measurement mark with a charged-particle beam and detecting scattered electrons from the measurement mark. The method also includes generating a voltage-contrast image from the detected scattered electrons. The method further includes determining an overlay value or critical dimension value from the generated voltage-contrast image.

In some embodiments, a non-transitory computer-readable medium is provided that stores instructions that, when executed by one or more processors, causes the processors to perform a method. The method includes scanning a set of first test structures of a measurement mark with a charged-particle beam and detecting scattered electrons from the measurement mark. The method also includes generating a voltage-contrast image from the detected scattered electrons.

The method further includes determining an overlay value or critical dimension value from the generated voltage-contrast image.

DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than 1/1000th of a human hair. Not surprisingly, semiconductor IC manufacturing is a complex process, with hundreds of individual steps. Errors in even one step have the potential to dramatically affect the functioning of the final product.

In particular, as the dimensions are reduced, the number of masking layers can grow and the sizes of the features (lines, cuts, etc.) that need to be aligned continue to shrink. For example, at 10 or 7 nm, there may be 80 or more masking layers, versus 40 layers at 28 nm. If these layers are not precisely measured, the features being patterned, deposited, and etched may not line up well from one layer to the next.

In one aspect of the present disclosure, an overlay mark (such as overlay mark 60 shown in FIG. 6) utilizing voltage-contrast effect is provided for measuring an overlay shift between two adjacent layers, as well as critical dimensions (CDs) of features on each layer. The accuracy of the overlay mark is determined by the resolution of the patterns formed on the overlay mark. Therefore, the overlay mark may be scanned by an electron beam tool that has a low resolution but high throughput.

As used throughout this disclosure, unless specifically stated otherwise, the term "or" encompasses all possible combinations, except where infeasible. For example, if it is stated that a device can include A or B, then, unless specifically stated otherwise or infeasible, the device can include A, or B, or A and B. As a second example, if it is stated that a device can include A, B, or C, then, unless specifically stated otherwise or infeasible, the device can include A, or B, or C, or A and B, or A and C, or B and C, or A and B and C.

Figure 1:
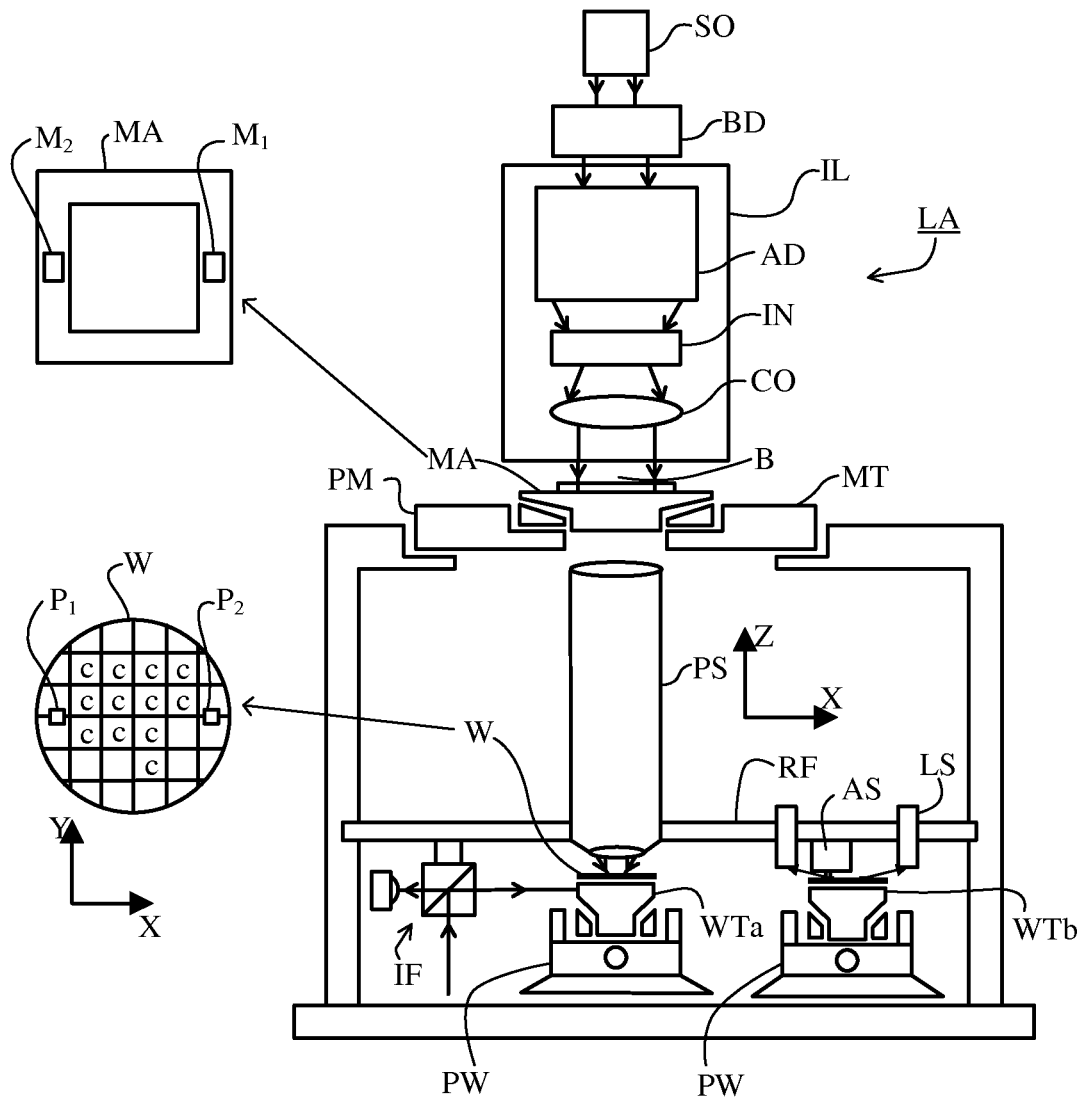
FIG. 1 is a schematic diagram illustrating an exemplary lithographic apparatus, consistent with embodiments of the present disclosure.

FIG. 1 is a schematic diagram illustrating an exemplary lithographic apparatus LA, consistent with embodiments of the present disclosure. Referring to FIG. 1, lithographic apparatus LA includes a source collector module SO, an illumination system (illuminator) IL configured to condition a radiation beam B (e.g., EUV radiation), a support structure (e.g., a mask table) MT constructed to support a patterning device (e.g., a mask or a reticle) MA and connected to a first positioner PM configured to accurately position the patterning device, a substrate table (e.g., a wafer table) WT constructed to hold a substrate (e.g., a resist-coated wafer) W and connected to a second positioner PW configured to accurately position the substrate, and a projection system (e.g., a reflective projection system) PS configured to project a pattern imparted to radiation beam B by patterning device MA onto a target portion C (e.g., comprising one or more dies) of substrate W.

Illumination system IL may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure may use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. The patterning device may be referred to as a reticle or a mask.

The patterning device may be a device used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which may be individually tilted so as to reflect an incoming radiation beam in different directions. The tilted mirrors impart a pattern in a radiation beam, which is reflected by the minor matrix.

The projection system may be any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The projection system may be referred to as a projection lens.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

Lithographic apparatus LA may be of a type having two (dual stage) or more tables (e.g., two or more substrate table, two or more patterning device support structures, or a substrate table and metrology table). In such multiple stage machines the additional tables may be used in parallel, or preparatory steps may be carried out on one or more tables while one or more other tables are being used for exposure.

Lithographic apparatus LA may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems Immersion does not necessarily mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors or a beam expander. In other cases, the source may be an integral part of the lithographic apparatus, for example when the source is a mercury lamp. Source SO and illuminator IL, together with beam delivery system BD if required, may be referred to as a radiation system.

Illuminator IL may include an adjuster AD for adjusting the angular intensity distribution of the radiation beam. Generally, at least the outer and inner radial extent (commonly referred to as .sigma.-outer and .sigma.-inner, respectively) of the intensity distribution in a pupil plane of the illuminator may be adjusted. In addition, the illuminator IL may include various other components, such as an integrator IN and a condenser CO. The illuminator may be used to condition the radiation beam, to have a desired uniformity and intensity distribution in its cross section.

Radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa may be moved accurately, e.g., so as to position different target portions C in the path of the radiation beam B. Similarly, the first positioner PM and another position sensor (which is not explicitly depicted in FIG. 1) may be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. In the present disclosure, "mark" and "target" are used interchangeably. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X or Y direction so that a different target portion C may be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation may be readily applied to maskless lithography that utilizes programmable patterning device, such as a programmable minor array of a type as referred to above.

Combinations or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables may be exchanged. For example, while a substrate on one table is being exposed at the exposure station, another substrate may be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
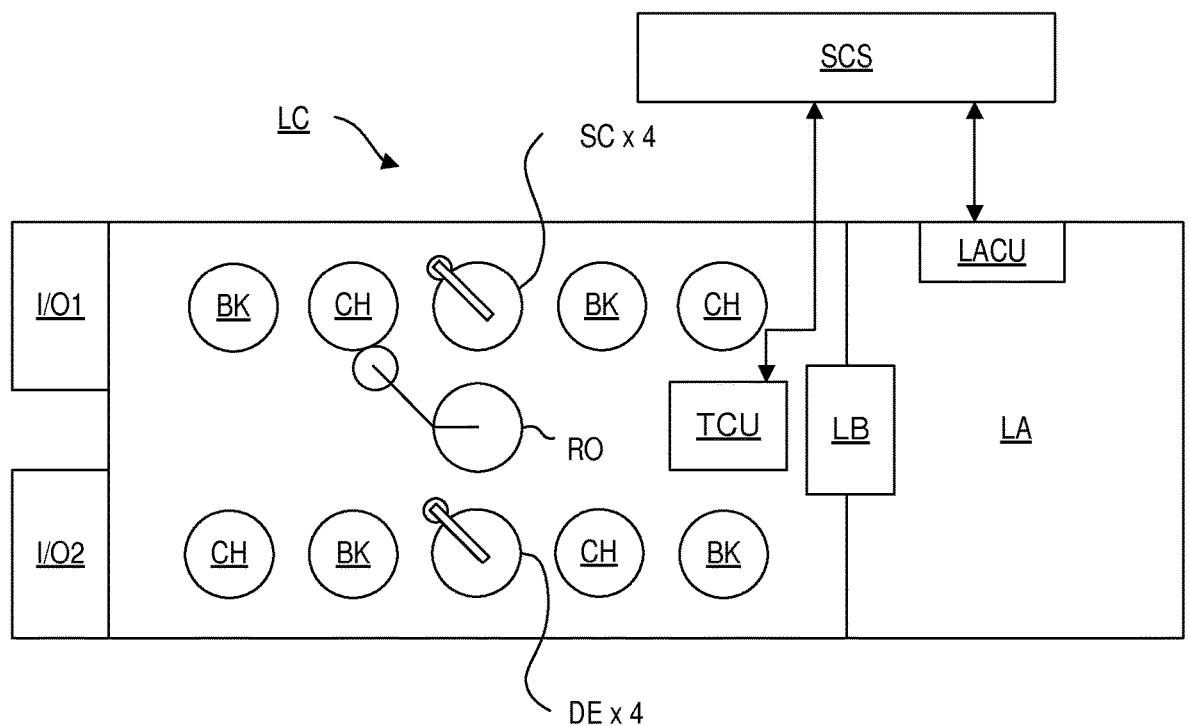
FIG. 2 is a schematic diagram illustrating an exemplary lithographic cell, consistent with embodiments of the present disclosure.

Lithographic apparatus LA shown in FIG. 1 may form a part of a lithographic cell, sometimes also referred to as a lithocell or lithocluster, which includes apparatus to perform one or more pre- and post-exposure processes on a substrate. FIG. 2 is a schematic diagram illustrating an exemplary lithographic cell LC, consistent with embodiments of the present disclosure. Referring to FIG. 2, lithographic cell LC may include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by a supervisory control system SCS, which also controls the lithographic apparatus via a lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties. These properties may include overlay error between subsequent layers, line thickness, critical dimension (CD), etc. Additionally, as described below, the inspection may be used to derive process parameters such as side-wall angle unbalance. If an error is detected, an adjustment may be made to an exposure of one or more subsequent substrates, especially if the inspection may be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions that are good. Another possibility is to adapt a setting of a subsequent process step to compensate for the error, e.g. the time of a trim etch step may be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer or across a substrate. The inspection apparatus may be integrated into lithographic apparatus LA or lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore, measurements may be taken after the post-exposure bake step (PEB), which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g., for the purpose of process control.

Figure 3:
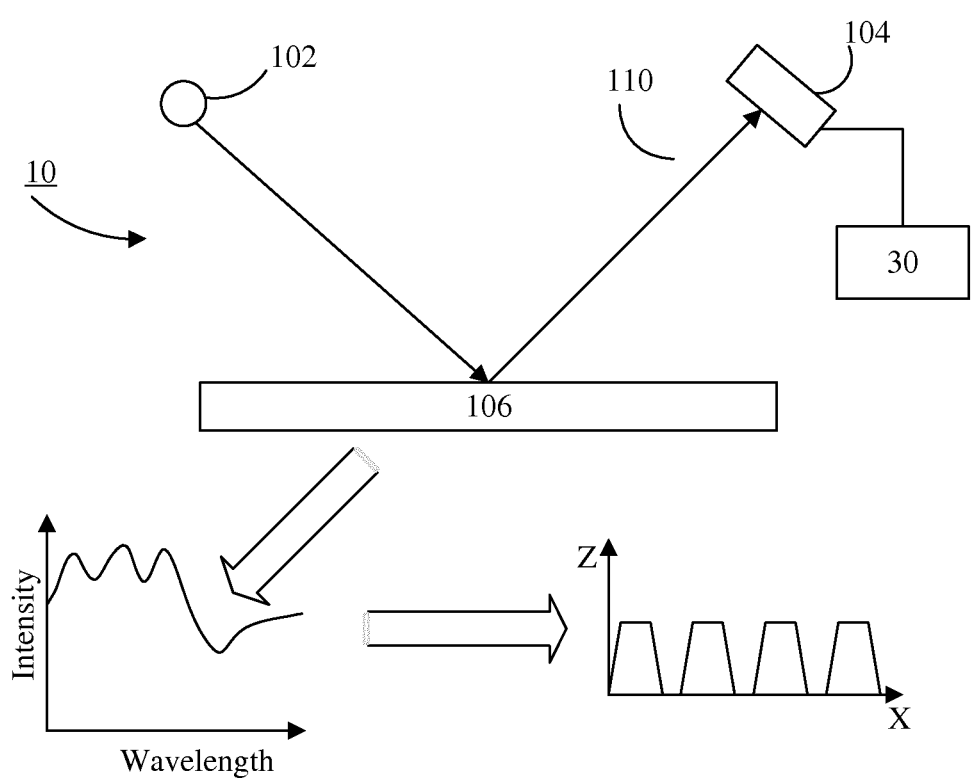
FIG. 3 is a schematic diagram illustrating an exemplary optical metrology tool, consistent with embodiments of the present disclosure.

In the disclosed embodiments, the inspection apparatus may be an optical metrology tool, such as a scatterometer. FIG. 3 is a schematic diagram illustrating an exemplary scatterometer 10, consistent with embodiments of the present disclosure. Referring to FIG. 3, scatterometer 10 includes a broadband (white light) radiation projector 102, which projects radiation onto a substrate 106. The reflected radiation is passed to a spectrometer detector 104, which measures a spectrum 110 (i.e. a measurement of intensity as a function of wavelength) of the reflected radiation. From this data, the structure or profile giving rise to the detected spectrum may be reconstructed by a controller 30 in communication with scatterometer 10. For example, controller 30 may reconstruct the structure or profile by Rigorous Coupled Wave Analysis and non-linear regression, or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. In various embodiments, scatterometer 10 may be configured as a normal-incidence scatterometer or an oblique-incidence scatterometer.

Figure 4:
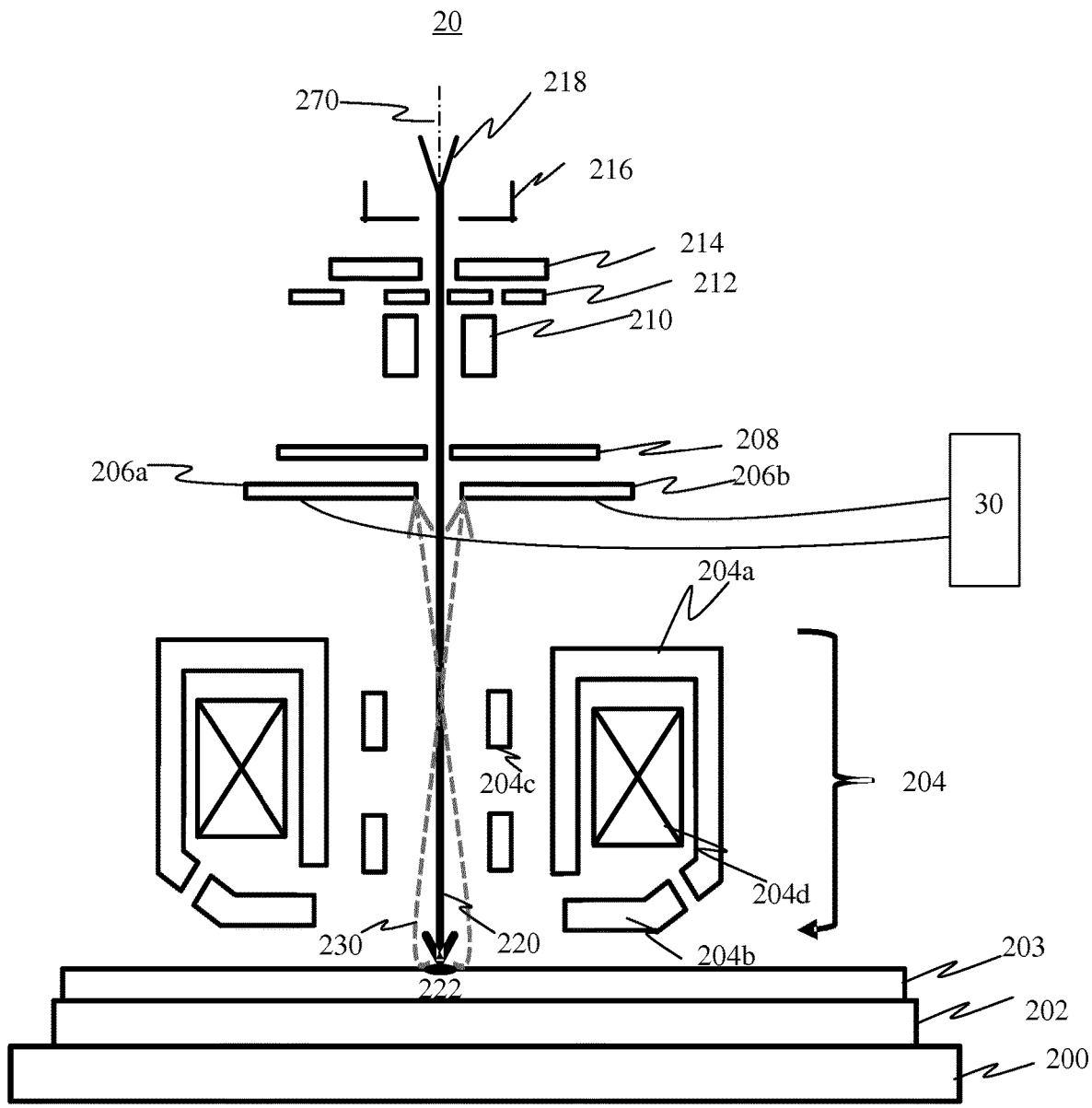
FIG. 4 is a schematic diagram illustrating an exemplary electron beam tool, consistent with embodiments of the present disclosure.

The resolution of the optical metrology tool is limited by the wavelength of light, which is typically a few hundred nanometers. In the disclosed embodiments, the inspection apparatus may also be a charged particle (e.g., electron) beam microscope, such as a scanning electron microscope (SEM), capable of resolution down to less than a nanometer. FIG. 4 is a schematic diagram illustrating an exemplary electron beam tool 20, consistent with the disclosed embodiments. As shown in FIG. 4, electron beam tool 20 includes a motorized stage 200, and a wafer holder 202 supported by motorized stage 200 to hold a wafer 203 to be inspected. Electron beam tool 20 further includes a compound objective lens 204, electron detector 206 (which includes electron sensor surfaces 206a and 206b), an objective aperture 208, a condenser lens 210, a beam limit aperture 212, a gun aperture 214, an anode 216, and a cathode 218, one or more of which may be aligned with an optical axis 270 of electron beam tool 20.

Compound objective lens 204, in some embodiments, may include a modified swing objective retarding immersion lens (SORIL), which includes a pole piece 204a, a control electrode 204b, a deflector or a set of deflectors 204c, and an exciting coil 204d. Electron beam tool 20 may additionally include an energy dispersive X-ray spectrometer (EDS) detector (not shown) to characterize the materials on the wafer.

A primary electron beam 220 is emitted from cathode 218 by applying a voltage between anode 216 and cathode 218. Primary electron beam 220 passes through gun aperture 214 and beam limit aperture 212, both of which may determine the current of electron beam entering condenser lens 210, which resides below beam limit aperture 212. Condenser lens 210 focuses primary electron beam 220 before the beam enters objective aperture 208 to set the current of the electron beam before entering compound objective lens 204.

Compound objective lens 204 may focus primary electron beam 220 onto wafer 203 for inspection and may form a probe spot 222 on surface of wafer 203. Deflector(s) 204c deflect primary electron beam 220 to scan probe spot 222 over wafer 203. For example, in a scanning process, deflector(s) 204c may be controlled to deflect primary electron beam 220 sequentially onto different locations of top surface of wafer 203 at different time points, to provide data for image reconstruction for different parts of wafer 203. Moreover, deflector 204c may also be controlled to deflect primary electron beam 220 onto different sides of wafer 203 at a particular location, at different tie points, to provide data for stereo image reconstruction of the wafer structure at that location. Further, in some embodiments, anode 216 and cathode 218 can be configured to generate multiple primary electron beams 220, and electron beam tool 104 may include a plurality of deflectors 204c to project the multiple primary electron beams 220 to different parts/sides of wafer 203 at the same time.

When a current is applied onto exciting coil 204d, an axially-symmetric (i.e., symmetric around optical axis 270) magnetic field will be generated in the wafer surface area. A part of wafer 203 being scanned by primary electron beam 220 may be immersed in the magnetic field. Different voltages are applied onto wafer 203, magnetic objective lens 204a, and control electrode 204b, to generate an axial symmetric retarding electric field near the wafer surface. The electric field reduces the energy of impinging primary electron beam 220 near the surface of the wafer before it collides with wafer 203. Control electrode 204b, being electrically isolated from pole piece 204a, controls an axially-symmetric electric field on the wafer to prevent micro-arcing of the wafer and to ensure proper beam focus at the wafer surface with the axially-symmetric magnetic field together.

A secondary electron beam 230 may be emitted from the part of wafer 203 upon receiving primary electron beam 220. Secondary electron beam 230 may be received by sensor surfaces 206a and 206b of electron detector 206. Electron detector 206 may generate a signal (e.g., a voltage, a current, etc.) that represents an intensity of secondary electron beam 230, and provide the signal to controller 30 in communication with electron detector 206. The intensity of secondary electron beam 230 may vary according to the external or internal structure of wafer 203. Moreover, as discussed above, primary electron beam 220 may be projected onto different locations of the top surface of wafer 203, or different sides of wafer 203 at a particular location, to generate secondary electron beams 230 of different intensities. Therefore, by mapping the intensity of secondary electron beam 230 with the locations of wafer 203, controller 30 may reconstruct an image that reflects the internal or external structures of wafer 203.

Moreover, although FIG. 4 shows electron beam tool 20 uses a single primary electron beam, it is contemplated that electron beam tool 20 may also be a multi-beam inspection tool that uses multiple primary electron beams. The present application does not limit the number of primary electron beams used in electron beam tool 20.

Figure 5:
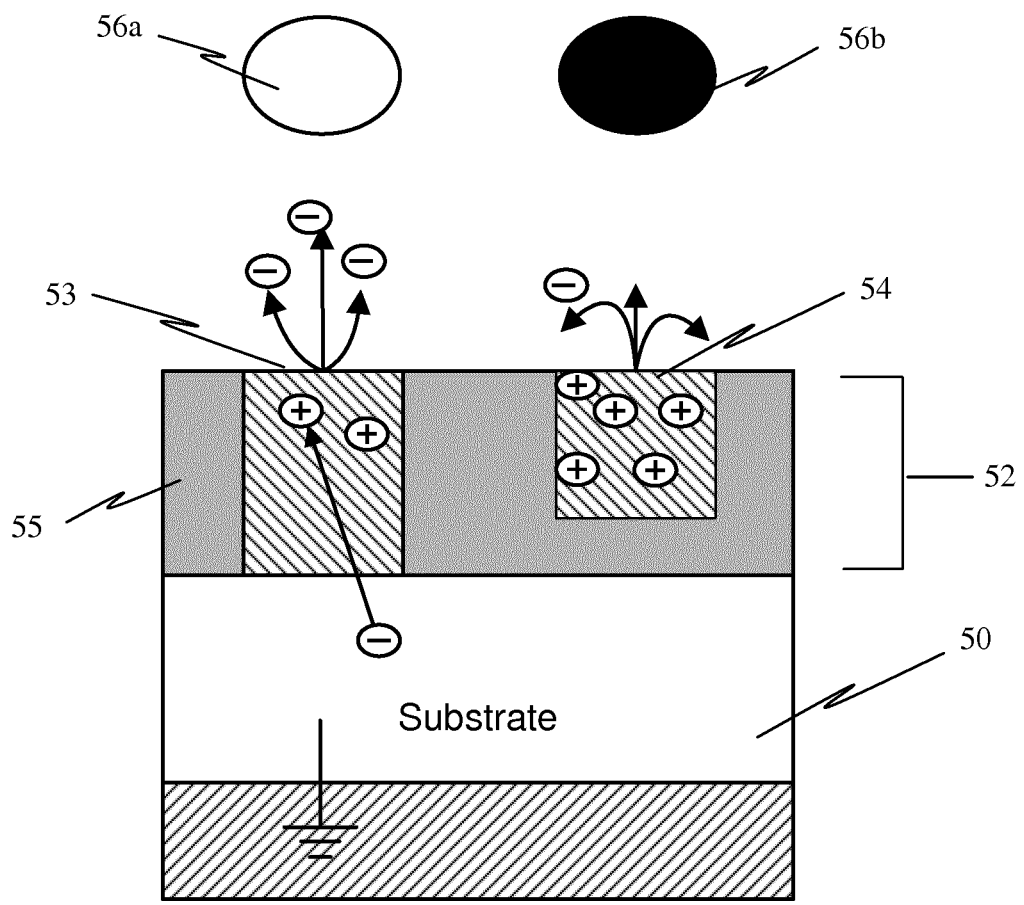
FIG. 5 is a schematic diagram illustrating voltage-contrast response of a substrate to electron-beam illumination, consistent with embodiments of the present disclosure.

Consistent with the present disclosure, electron beam tools may be used to measure overlay misalignment and critical dimensions based on the voltage-contrast response of a substrate to electron beam illumination. FIG. 5 is a schematic diagram illustrating a voltage-contrast response model, consistent with embodiments of the present disclosure. Referring to FIG. 5, a test structure 52 is developed on top of a substrate 50. Test structure 52 includes multiple features 53, 54 separated by insulating material 55. When electron-beam tool 20 scans the surface of test structure 52, controller 30 may generate a voltage-contrast image 56 of the test structure. Feature 53 is shorted to the ground and will not retain positive charges. As such, feature 53 may repel more secondary electrons and will appear as a bright region on the voltage-contrast image. In contrast, feature 54 is disconnected from the group and will have a positive charge build-up, which causes feature 54 to repel less secondary electrons, and hence appear dark on the voltage-contrast image.

The foregoing description has described the existence of short circuit conditions resulting in the corresponding features appearing bright, and the existence of open circuit conditions resulting in the corresponding features appearing dark. However, it is apparent to those skilled in the art that the bright and dark appearance may be changed and even reversed depending on the actual processing of the test structures or the setting of the electron-beam tools.

Figure 6:
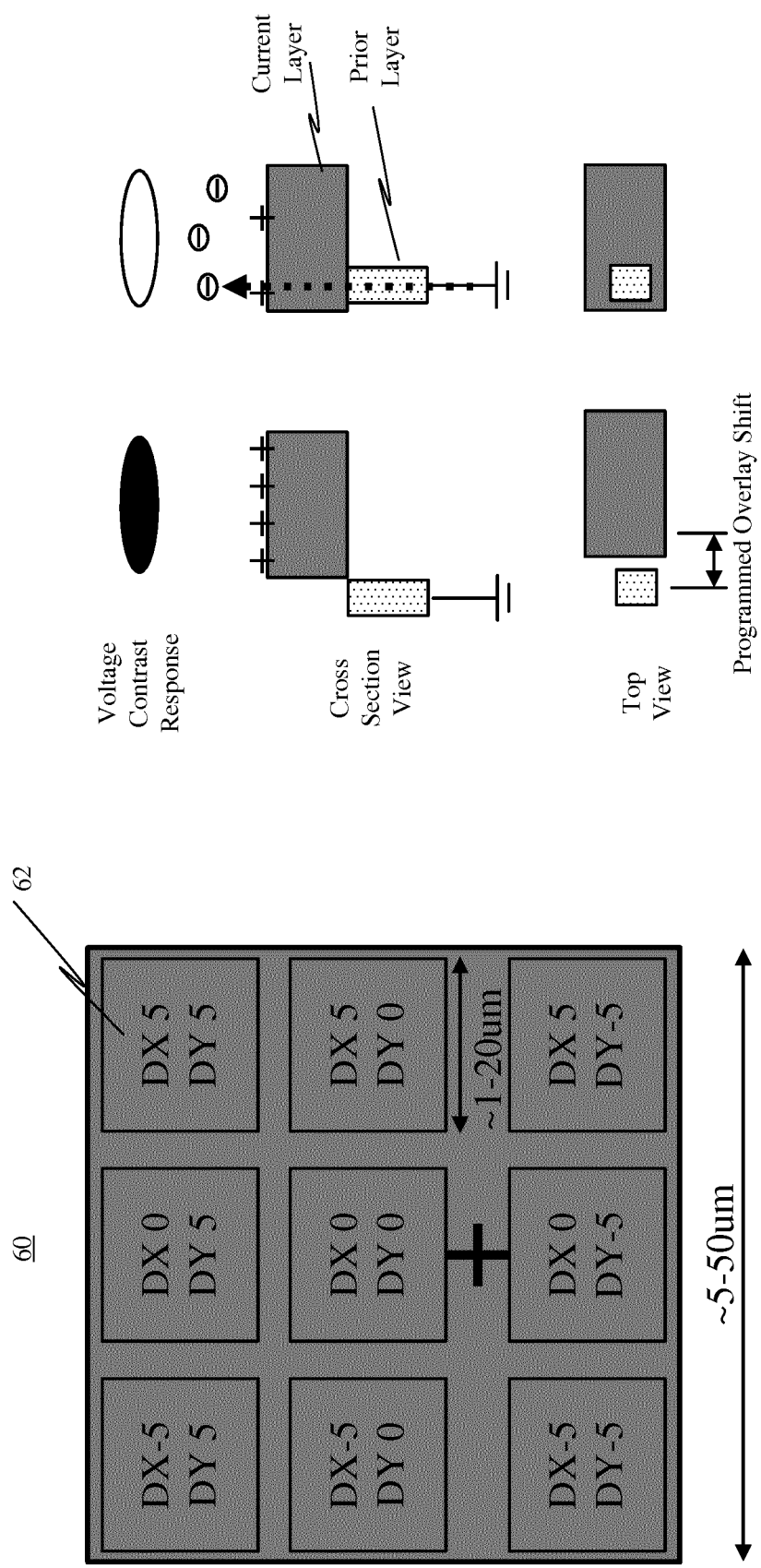
FIG. 6 is a schematic diagram illustrating a voltage-contrast metrology mark, consistent with embodiments of the present disclosure.

FIG. 6 is a schematic diagram illustrating a voltage-contrast metrology mark, consistent with embodiments of the present disclosure. The left hand side of FIG. 6 shows a top plan view of an overlay mark 60. Overlay mark 60 includes a plurality of test structures 62 for determining the registration error, such as edge placement error, between two wafer layers in two different directions. Although the left hand side of FIG. 6 only shows the test structures in a top layer (hereinafter also referred to as "current layer" or "first layer"), it is contemplated that a second layer (hereinafter also referred to as "prior layer") immediately below the top layer also includes a plurality of test structures 62. Moreover, although the left hand side of FIG. 6 only shows nine test structures 62 arranged in a 3×3 matrix, it is contemplated that the disclosed overlay mark may include as many test structures 62 as needed.

In the illustrated embodiment, test structures 62 are square shaped and may have a size similar to the pixel size of electron beam tool, in order to increase the inspection throughput. Test structures 62 are spatially separated from one another so that they do not overlap portions of an adjacent test structure of a second layer. As discussed above, test structures 62 are configured to provide overlay information in two directions, such as the X and Y directions that are orthogonal to each other. Each test structure 62 contains a periodic structure (not shown) including features that are arranged in spaced apart rows and columns.

The right hand side of FIG. 6 shows a voltage-contrast response of test structures 62 to electron beam illumination. The periodic features in test structures 62 are made of electrically conducting material. In some embodiments, the conducting materials may be metal, including but not limited to copper, tungsten, nickel, cobalt, tantalum, and titanium nitride. In some embodiments, the conducting material may be semiconductor, including but not limited to crystalline silicon, polycrystalline silicon, amorphous silicon, and silicon-germanium. The features in different wafer layers may use the same type of conducting material or different types of conducting material. When a feature in a current layer (i.e., top layer) connects to a feature in a prior layer (i.e., lower layer), the corresponding test structure 62 will show as a bright region on a voltage-contrast image of overlay mark 60. In contrast, when a feature in the current layer is disconnected from features in the prior layer, the corresponding test structure 62 will show as a dark region on the voltage-contrast image. As discussed above, the size of test structure 62 may be made similar or equal to the pixel size of electron beam tool 20, such that one pixel of the voltage-contrast image corresponds to a test structure 62. This way, the inspection throughput can be improved.

In the disclosed embodiments, test structures 62 are programmed to have different overlay offset values, i.e., X/Y values. For example, as shown in the left hand side of FIG. 6, test structures 62 may have varying overlay offset values in the X and Y directions, respectively. Based on the overlay offset values and the voltage-contrast image, the overlay error can be more accurately determined.

Figure 7:
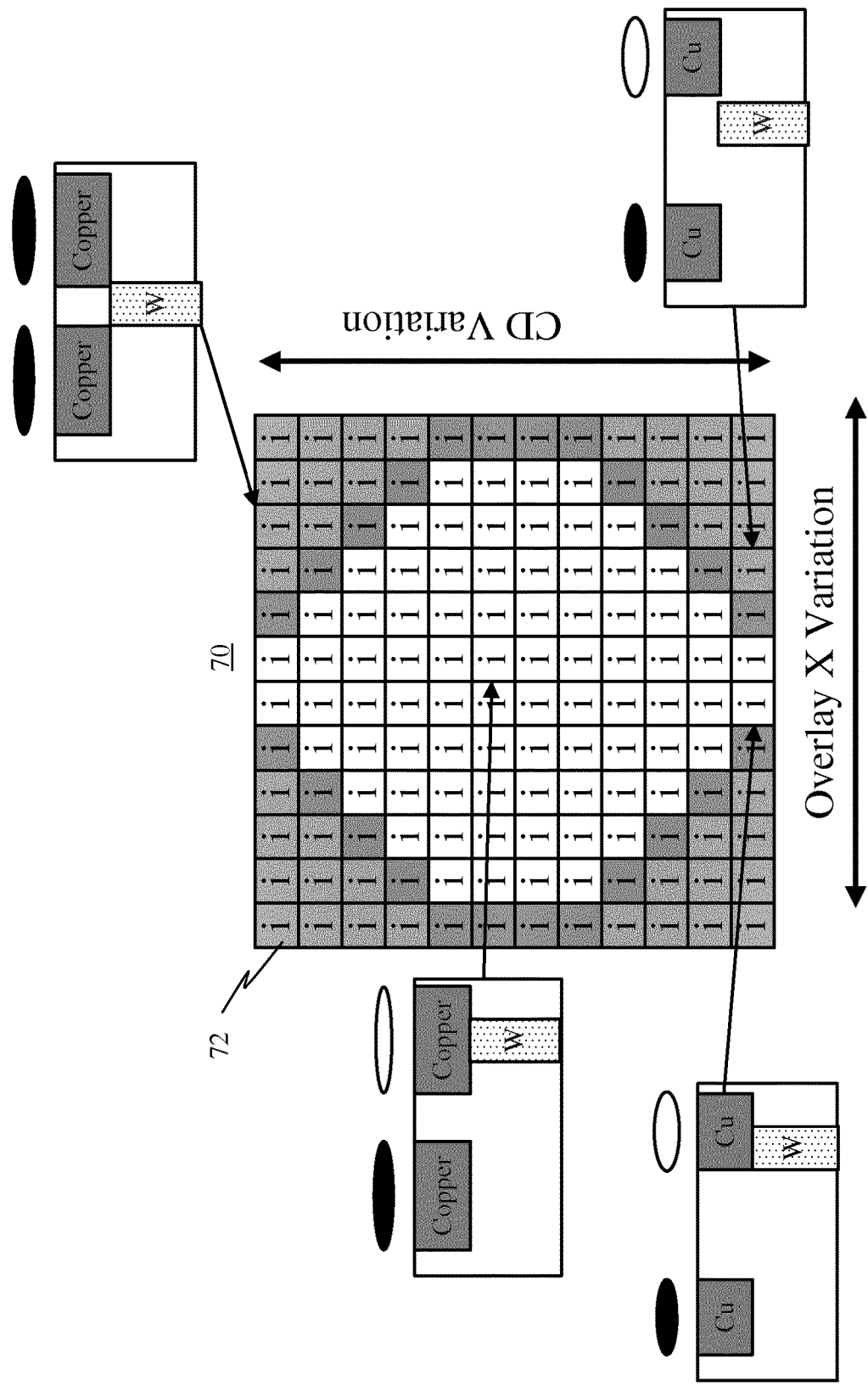
FIG. 7 is a schematic diagram illustrating a voltage-contrast metrology mark, consistent with embodiments of the present disclosure.

The disclosed overlay mark may also be used to measure critical dimensions. FIG. 7 is a schematic diagram illustrating a voltage-contrast metrology overlay mark 70, consistent with embodiments of the present disclosure. Similar to overlay mark 60, mark 70 includes a plurality of test structures 72. However, unlike mark 60, test structures 72 are designed to have varying critical-dimension values in the Y direction. Each test structure 72 contains a periodic structure (not shown) including features that are arranged in spaced apart rows and columns. The periodic features may be configured with a variety of sizes, shapes, and distributions. Moreover, pitches of the features may vary across test structures 72 in order to separate the proximity effects or stochastic effects.

FIG. 7 shows a scenario in which various overlay offset or critical dimension may cause the features in the current layer and prior layer to be connected or disconnected, which lead to different voltage-contrast responses. This way, mark 70 may be used to simultaneously measure the overlay error in the X direction and the critical dimension. The above example is for illustration purpose only. It is appreciated that the disclosed mark may be configured to have any suitable combination of overlay process windows and critical-dimension values. For example, one mark may include multiple adjacent test structures to track asymmetric critical dimensions or overlay process windows.

The disclosed overlay mark can be used with a low resolution mode of the electron scanning tool (e.g., electron beam tool 20), while still achieving accurate overlay/CD measurement even. This is because the accuracy of the overlay/CD measurement is controlled by the resolution of the features of the overlay mark. Typically, a state-of-art electron beam tool uses a spot size of 1-2 nm to perform high resolution imaging. However, smaller spot size, and consequently lower beam current, requires longer scanning time, and therefore lowers the system throughput. Because the disclosed overlay mark is much less sensitive to the resolution of the electron beam tool, it may be used with electron beam tools with a spot size of ~20 nm pixel, 200 nm pixel, or even 2 µm spot size with very high scanning rates to infer sub nm overlay. In particular, the larger spot size allows higher beam current, which can produce images that have sufficient signal-to-noise ratio and contrast resolution. The bright and dark pattern formed on the image of the overlay mark can accurately reflect the overlay and CD values. Therefore, the disclosed overlay mark allows high resolution imaging and high beam current to be achieved simultaneously, thereby allowing for a high scanning speed to improve the system throughput.

Figure 8:
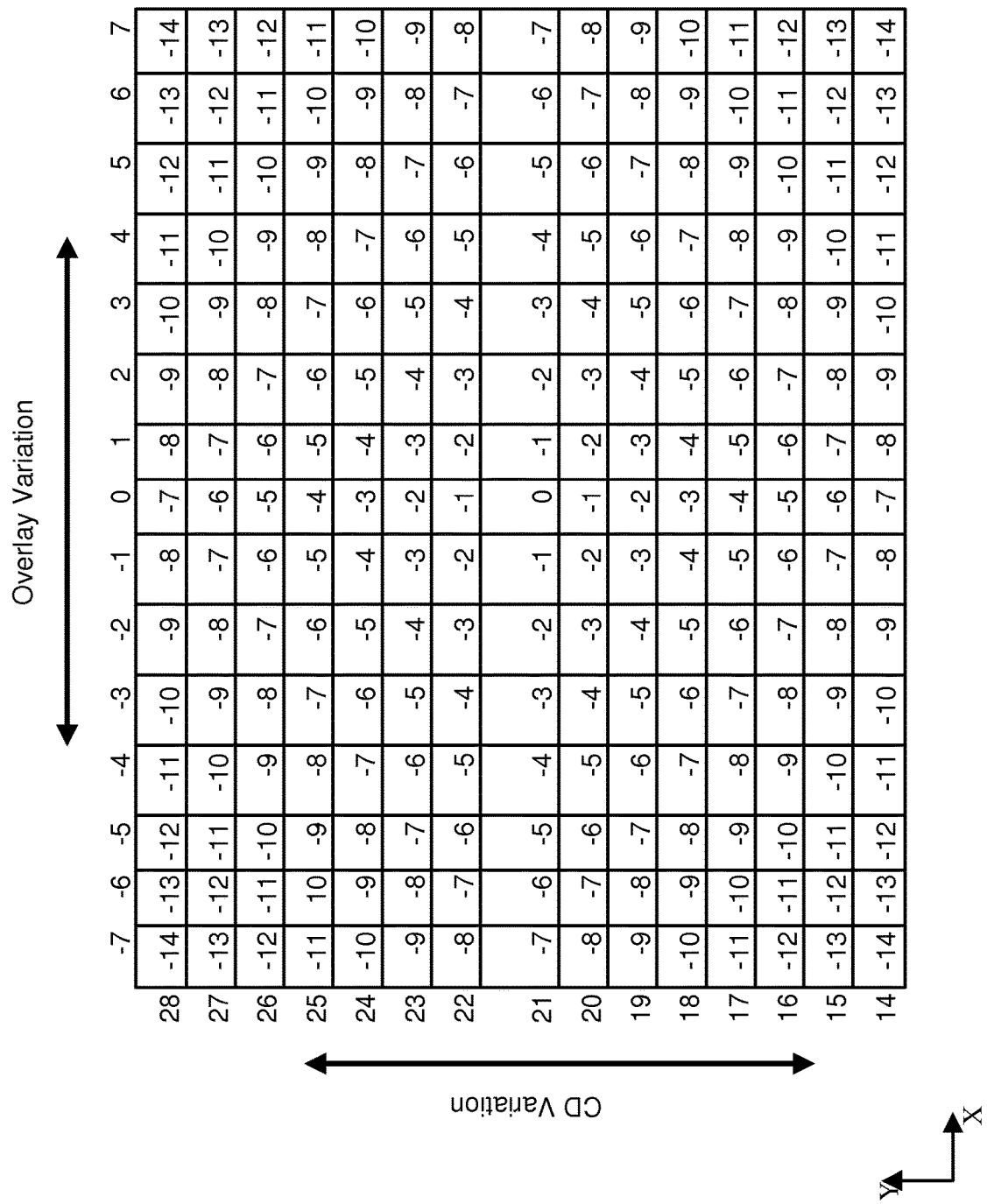
FIG. 8 is a schematic diagram illustrating a programmed overlay shift and CD variation in the mark shown in FIG. 7, consistent with embodiments of the present disclosure.

FIG. 8 is a schematic diagram illustrating a programmed overlay shift and CD variation in overlay mark 70, consistent with embodiments of the present disclosure. Referring to FIG. 8, overlay mark 70 may be programmed to have overlay variation along the X direction, and CD variation over the Y direction. The variations are in a range of from a fraction of one nanometer (e.g., 0.5 nanometer) to several nanometers. As such, mark 70 can measure the overlay variations and CDs at a device level.

In some embodiments, different marks can be integrated into a single "multi patterning" mark. This means that the interaction of multiple masks can have complex overlay and critical dimension interactions, which all can be studied by combination of different masks in specific overlay shifts or CD shifts. A multi patterning mark can be used for a single conductor layer created by the combination of multiple lithography steps, which is commonly used in sub-22 nm devices.

Consistent with the present disclosure, a process window may be characterized as an area or region in a two-dimensional overlay-CD plot. When a wafer is exposed in an overlay-CD condition within the process window, the chips made from the wafer will generally be functional, while when the wafer is exposed in an overlay-CD condition outside the process window, the chips made from the wafer will generally not be functional.

Moreover, the process window for a lithography process is further limited because different patterns within a circuit design may have different process windows. These differences may include shifts in the best focal plane position, shifts in the best exposure, shifts in best overlay location, and changes in the allowed range of focus or exposure. Different patterns may also have different criteria for successful printing. While CD variation of up to +/−15% may be tolerable for some non-critical features, the tolerance for the most critical structures may be only half as much. The failure modes of different patterns may also be very different. Some patterns may be considered unacceptable due to excessive CD variation, others due to excessive changes in their sidewall profiles, and yet others may suffer from excessive line end pullback or corner rounding. Catastrophic pattern failures are also possible due to the interaction of neighboring structures. A CD variation that may be acceptable if a given feature were being printed as an isolated structure might cause bridging, necking, or other unacceptable pattern variations in a different local environment.

In some embodiments, a stochastic algorithm may be used to adjust the overlay (or pitch) variation and CD variation separately to quantify the process window. A distribution of the overlay variations and CD variations may be correlated with wafer chip yield maps. Statistical analysis may be used to extract information on, for example, which overlay variation or CD variation is the critical yield limiting factor or is most highly correlated with certain signatures of yield fluctuations or excursions.

In some embodiments, the determined process window may be provided as feedback to a lithography process control system providing data as to how the lithography process is performing e.g., whether the CDs and layer alignment for all features are within specification, and which process condition parameters should be adjusted and by how much in order to maintain the lithography process and exposure tool at the optimum operating condition. As used in the present disclosure, "process condition parameters" refer to any of the exposure tool parameters or the lithographic process parameters. The process condition parameters may also be called "input parameters" to the lithography process. This feedback process may be repeated to ensure the lithographic process is closely controlled.

Figure 9:
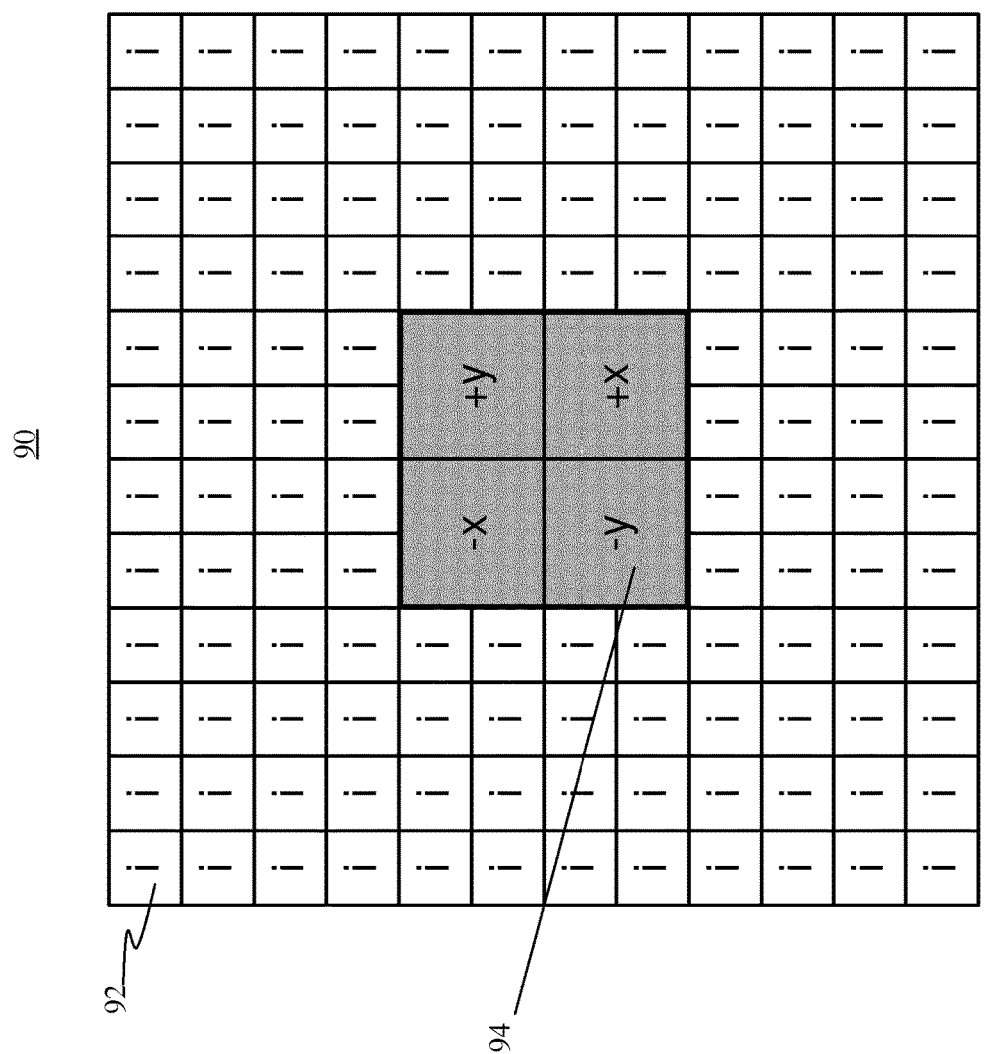
FIG. 9 is a schematic diagram illustrating a combined voltage-contrast and optical metrology mark, consistent with embodiments of the present disclosure.

The disclosed voltage-contrast marks require the measurements to be performed after etching, filling, and polishing of the current layer, and thus may cause delay in getting the overlay or CD information. To solve this problem, the present disclosure also provides a combined voltage-contrast and optical metrology mark. FIG. 9 is a schematic diagram illustrating a combined voltage-contrast and optical metrology mark 90, consistent with embodiments of the present disclosure. Referring to FIG. 9, mark 90 may include a plurality of voltage-contrast test structures 92, whose configurations are similar to those of test structures 62 (FIG. 6) and 72 (FIG. 7). As such, electron beam tool 20 may scan test structures 92 and obtain voltage-contrast responses of test structures 92, in order to determine overlay and critical-dimension information.

Figure 10:
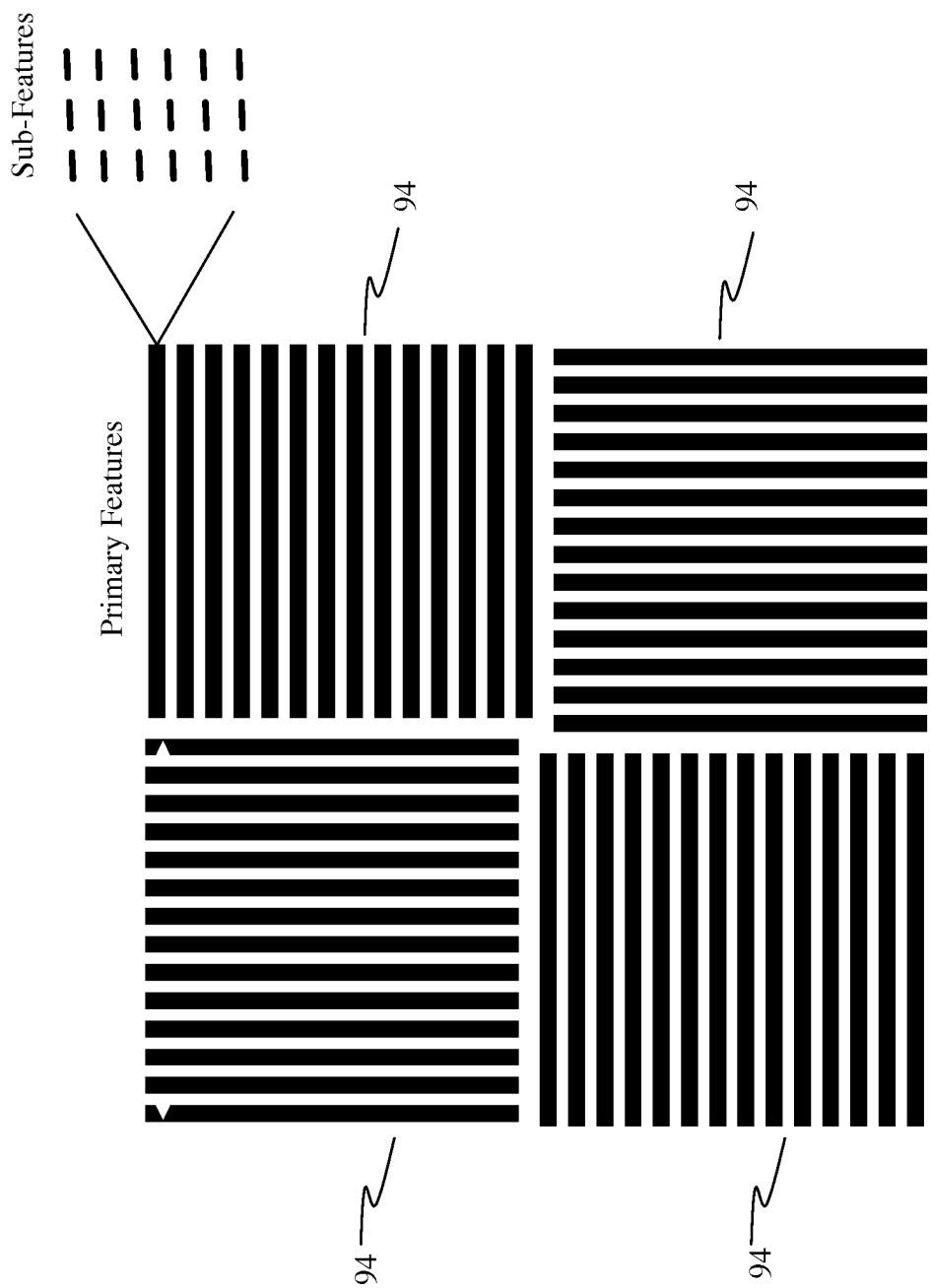
FIG. 10 is a schematic diagram illustrating features in the combined voltage-contrast and optical mark, consistent with embodiments of the present disclosure.

Moreover, mark 90 may include a plurality of optical test structures 94. FIG. 10 is a schematic diagram illustrating features in optical test structures 94, consistent with embodiments of the present disclosure. Referring to FIG. 10, four optical test structures 94 are positioned closely together so that they are all within a field of view of scatterometer 10 (e.g., within a measurement spot formed by the illumination beam of scatterometer 10). Thus, the four optical test structures 94 can be simultaneously illuminated and simultaneously imaged by scatterometer 10. Each optical test structure 94 includes a plurality of primary features forming a grating, whose pitch is determined by a sensitivity of scatterometer 10. That is, the pitch typically is determined by the optics of the optical metrology tool scatterometer 10. As such, the pitch of the primary features is typically in the order of several hundred nanometers. The gratings formed by the primary features may have differently biased overlay offsets in order to facilitate measurement of overlay between different wafer layers. The gratings formed by the primary features may also differ in their orientation, as shown in FIG. 10, so as to diffract incoming radiation in X and Y directions. While four gratings are illustrated in FIG. 10, another embodiment may include a larger matrix to obtain desired accuracy. For example, a 3×3 array of nine test structures 94 may be used.

The test structures 94 as described herein may be, for example, overlay targets designed for use with a metrology tool such as YieldStar® stand-alone or integrated metrology tool, and alignment targets such as those typically used with a TwinScan® lithographic system, both available from ASML.

Still referring to FIG. 10, the primary features in test structure 94 may be further segmented into a plurality of periodic sub-features whose pitch is determined by the sensitivity of electron beam 20. For example, the pitch of the sub-features can be set in between 10-200 nanometers. As such, the sub-features may be scanned by electron beam tool 20 and provide voltage-contrast response at device resolution. The pitch of the sub-features can be selected such that a range of overlays are measured for each such structure. Moreover, the sub-features may be configured to be two dimensional, e.g., with pitches in both the X and Y directions.

As described above, a single mark (e.g., mark 90) can be designed for both voltage-contrast and optical measurement. The measurement based on the voltage-contrast mark can be used to calibrate the measurement based on the optical measurement, and vice versa. The optical measurement can be performed at ADI (after-development inspection). The voltage-contrast measurements can be performed after etching and polishing. Thus, mark 90 allows optical measurements of ADI overlay and a process window and position within that window after further processing of the mark. This combination allows measuring the process window while also making wafer rework possible.

The embodiments may further be described using the following first set of clauses. References to clauses in this first set of clauses are to clauses in this same set of clauses.

1. A measurement mark comprising:
   a set of first test structures developed in a first layer on a substrate, each of the set of first test structures comprising a plurality of first features made of first conducting material; and
   a set of second test structures developed in a second layer adjacent to the first layer, each of the set of second test structures comprising a plurality of second features made of second conducting material,
   wherein the measurement mark is configured to indicate connectivity between the set of first test structures and associated second test structures in the set of second test structures when imaged using a voltage-contrast imaging method.

2. The measurement mark of clause 1, wherein the voltage-contrast image shows one of the set of second test structures has a low voltage when the second test structure forms a short circuit with one of the set of first test structures.

3. The measurement mark of any one of clauses 1 and 2, wherein the voltage-contrast image shows one of the set of second test structures has a high voltage when the second test structure is in an open circuit with the set of first test structures.

4. The measurement mark of any one of clauses 1 to 3, wherein a combination of the set of first test structures and the set of second test structures is configured to convey overlay information in a first direction along a surface of the substrate.
5. The measurement mark of clause 4, wherein at least one of the set of first test structures and the set of second test structures is configured to have varying pitch values in the first direction.
6. The measurement mark of clause 4, wherein a combination of the set of first test structures and the set of second test structures is further configured to convey overlay information in a second direction along a surface of the substrate, the second direction differing from the first direction.
7. The measurement mark of clause 6, wherein the second direction is orthogonal to the first direction.
8. The measurement mark of clause 4, wherein a combination of the set of first test structures and the set of second test structures is further configured to convey critical-dimension information in a second direction along a surface of the substrate, the second direction differing from the first direction.
9. The measurement mark of clause 4, wherein at least one of the set of first test structures and the set of second test structures has varying critical-dimension values in the second direction.
10. The measurement mark of clause 9, wherein the second direction is orthogonal to the first direction.
11. The measurement mark of any one of clauses 1 to 3, wherein a combination of the set of first test structures and the set of second test structures is further configured to convey critical-dimension information in a direction along a surface of the substrate.
12. The measurement mark of clause 11, wherein at least one of the set of first test structures and the set of second test structures has varying critical-dimension values in the direction.
13. The measurement mark of any one of clauses 1 to 12, wherein the measurement mark is a mask including the set of first test structures and the set of second structures.
14. The measurement mark of any one of clauses 1 to 13, further comprising:
a set of third test structures developed in the first layer, each of the set of third test structures comprising a plurality of third periodic features whose pitch is determined by a sensitivity of an optical metrology tool; and
a set of fourth test structures developed in the second layer, each of the set of fourth test structures comprising a plurality of fourth periodic features whose pitch is determined by the sensitivity of the optical metrology tool.
15. The measurement mark of clause 14, wherein at least one of the set of third test structures and the set of fourth test structures is positioned within a perimeter that corresponds to a field of view of the optical metrology tool.
16. The measurement mark of any one of clauses 14 and 15, wherein each of the plurality of third periodic features and the plurality of fourth periodic features is further segmented into a plurality of sub-features whose pitch is determined by a sensitivity of an electron beam tool.
17. The measurement mark of clause 16, wherein the sub-features of the third features are the first periodic features and in which the sub-features of the periodic features are the second periodic features.
18. The overlay mark of clause 14, wherein the plurality of third periodic features and the plurality of fourth periodic features are made of the first conducting material and the second conducting material, respectively.
19. The overlay mark of any one of clauses 1 to 18, wherein each of the first conducting material and the second conducting material comprises semiconductor.
20. The overlay mark of clause 19, wherein the semiconductor comprises at least one of crystalline silicon, polycrystalline silicon, amorphous silicon, and silicon-germanium.
21. The overlay mark of any one of clauses 1 to 18, wherein each of the first conducting material and the second conducting material comprises metal.
22. The overlay mark of clause 21, wherein the metal comprises at least one of copper, tungsten, nickel, cobalt, tantalum, and titanium nitride.
23. A measurement mark comprising:
a first array of first features at a first pitch and a second array of second features at a second pitch, the first array and the second array being arranged in two consecutive layers on a substrate, wherein the measurement mark is configured for determining an overlay value between the first features relative to associated second features or is configured for determining a critical dimension value of the first features or the second features when imaged using a voltage-contrast imaging method.
24. The measurement mark of clause 23 wherein the first pitch and second pitch are different.
25. The measurement mark of any one of clauses 23 and 24, wherein the first pitch and second pitch vary in one direction or two directions along a surface of the substrate.
26. The measurement mark of any one clauses 23 to 25, wherein at least one of a duty cycle of the first features and a duty cycle of the second features is configured to have vary values.
27. The measurement mark any one clauses 23 to 26, wherein at least one of the first features comprises a sub-array of sub-features.
28. The measurement mark any one clauses 23 to 27, at least one of the first array of first features and the second array of second features is configured to have varying critical dimensions.
29. A system comprising:
an electron beam tool for scanning a measurement mark according to clause 1 and for detecting scattered electrons from the measurement mark; and
a controller coupled with the electron beam tool and configured to:
generate a voltage-contrast image from the detected scattered electrons; and
determine an overlay value and/or critical dimension value from the generated voltage-contrast image.
30. The system of clause 29, wherein the controller is further configured to:
when the voltage-contrast image shows one of the set of second test structures has a low voltage, determining that the second test structure forms a short circuit with one of the set of first test structures.
31. The system of any one of clauses 29 and 30, wherein the controller is further configured to:
when the voltage-contrast image shows one of the set of second test structures has a high voltage, determining that the second test structure is in an open circuit with the set of first test structures.

32. The system of any one of clauses 29 to 31, wherein at least one of the set of first test structures and the set of second test structures is configured to have varying overlay offset values in a first direction along a surface of the substrate.

33. The system of any one clauses 29 to 32, wherein at least one of the set of first test structures and the set of second test structures is configured to have varying overlay offset values in a second direction along the surface of the substrate, the second direction differing from the first direction.

34. The system of clause 33, wherein the second direction is orthogonal to the first direction.

35. The system of any one of clauses 32 to 34, wherein the controller is further configured to determine overlay information based on the voltage-contrast image and the overlay offset values.

36. The system of clause 32, wherein at least one of the set of first test structures and the set of second test structures has varying critical-dimension values in a second direction that differs from the first direction.

37. The system of clause 36, wherein the second direction is orthogonal to the first direction.

38. The system of any one of clauses 36 and 37, wherein the controller is further configured to determine critical-dimension information based on the voltage-contrast image.

39. The system of any one of clause 38, wherein the controller is further configured to determine critical-dimension information based on the voltage-contrast image.

40. The system of any one of clauses 29 to 39, further comprising:
an optical metrology tool for scanning the measurement mark according to clause 14; and
the controller is further configured to determine at least one of overlay information and critical-dimension information based on the voltage-contrast image and an output of the optical metrology tool.

41. The system of clause 40, wherein:
each of the plurality of third periodic features and the plurality of fourth periodic features is further segmented into a plurality of periodic sub-features whose pitch is determined by a sensitivity of an electron beam tool;
the electron beam tool is further configured to scan the set of fourth test structures and detect electrons scattered by the set of fourth test structures, after etching of the second layer; and
the controller is further configured to determine at least one of overlay information and critical-dimension information based on an output of the electron beam tool.

42. The system of clause 43, wherein the plurality of third periodic features and the plurality of fourth periodic features are made of the first conducting material and the second conducting material, respectively.

43. The system of any one of clauses 29 to 43, wherein each of the first conducting material and the second conducting material comprises semiconductor.

44. The system of clause 43, wherein the semiconductor comprises at least one of crystalline silicon, polycrystalline silicon, amorphous silicon, and silicon-germanium.

45. The system of any one of clauses 29 to 43, wherein each of the first conducting material and the second conducting material comprises metal.

46. The system of clause 45, wherein the metal comprises at least one of copper, tungsten, nickel, cobalt, tantalum, and titanium nitride.

47. A method comprising:
scanning, by an electron beam tool, a measurement mark and detecting, by the electron beam tool, electrons scattered from the measurement mark, the measurement mark comprising:
a set of first test structures developed in a first layer adjacent to a substrate, each of the set of first test structures comprising a plurality of first features made of first conducting material; and
a set of second test structures developed in a second layer disposed adjacent to the first layer, each of the set of second test structures comprising a plurality of second features made of second conducting material; and
generating, by a controller, a voltage-contrast image of the set of second test structures based on the detected electrons; and
determining, by the controller, connectivity between the set of first test structures and the set of second test structures based on the voltage-contrast image.

48. The method of clause 47, further comprising:
when the voltage-contrast image shows one of the set of second test structures has a low voltage, determining that the second test structure forms a short circuit with one of the set of first test structures.

49. The method of any one of clauses 47 and 48, further comprising:
when the voltage-contrast image shows one of the set of second test structures has a high voltage, determining that the second test structure is in an open circuit with the set of first test structures.

50. The method of any one of clauses 47 to 49, wherein at least one of the set of first test structures and the set of second test structures is configured to have varying overlay offset values in a first direction along a surface of the substrate.

51. The method of clause 50, wherein at least one of the set of first test structures and the set of second test structures has varying overlay offset values in a second direction along the surface of the substrate, the second direction differing from the first direction.

52. The method of clause 51, wherein the second direction is orthogonal to the first direction.

53. The method of any one of clauses 50 to 52, further comprising:
determining, by the controller, overlay information based on the voltage-contrast image and the overlay offset values.

54. The method of clause 50, wherein at least one of the set of first test structures and the set of second test structures has varying critical-dimension values in a second direction along the surface of the substrate, the second direction differing from the first direction.

55. The method of clause 54, wherein the second direction is orthogonal to the first direction.

56. The method of any one of clauses 54 and 55, further comprising:
determining critical-dimension information based on the voltage-contrast image.

55. The method of any one of clauses 47 to 49, wherein at least one of the set of first test structures and the set of second test structures is configured to have varying critical dimensions in a first direction along a surface of the substrate.
56. The method of clause 55, further comprising:
determining, by the controller, critical-dimension information based on the voltage-contrast image.
57. The method of any one of clauses 47 to 56, wherein:
the measurement mark further comprises:
a set of third test structures developed in the first layer, each of the set of third test structures comprising a plurality of third features whose pitch is determined by a sensitivity of the optical metrology tool; and
a set of fourth test structures developed in the second layer, each of the set of fourth test structures comprising a plurality of fourth features whose pitch is determined by the sensitivity of the optical metrology tool; and
the method further comprises:
scanning, by the optical metrology tool, the set of fourth test structures and detect, by the optical metrology tool, light scattered from the set of fourth test structures, during after developing inspection of the second layer; and
determining, by the controller, at least one of overlay information and critical-dimension information based on an output of the optical metrology tool.
58. The method of clause 57, wherein:
each of the plurality of third periodic features and the plurality of fourth periodic features is further segmented into a plurality of periodic sub-features whose pitch is determined by a sensitivity of an electron beam tool; and
the method further comprises:
scanning, by the electron scanning tool, the set of fourth test structures and detecting, by the electron beam tool, electrons scattered by the set of fourth test structures, after etching of the second layer; and
determining, by the controller, at least one of overlay information and critical-dimension information based on an output of the electron beam tool.
59. The method of clause 57, wherein the plurality of third periodic features and the plurality of fourth periodic features are made of the first conducting material and the second conducting material, respectively.
60. The method of any one of clauses 47 to 59, wherein each of the first conducting material and the second conducting material comprises semiconductor.
61. The method of clause 60, wherein the semiconductor comprises at least one of crystalline silicon, polycrystalline silicon, amorphous silicon, and silicon-germanium.
62. The method of any one of clauses 47 to 59, wherein each of the first conducting material and the second conducting material comprises metal.
63. The method of clause 64, wherein the metal comprises at least one of copper, tungsten, nickel, cobalt, tantalum, and titanium nitride.
64. A non-transitory computer-readable medium storing instructions that, when executed by one or more processors, cause the processors to perform a method comprising:
receiving an output of an electron beam tool, wherein the electron beam tool scans a measurement mark and detects electrons scattered from the measurement mark, the measurement mark comprising:
a set of first test structures developed in a first layer disposed on a substrate, each of the set of first test structures comprising a plurality of first features made of first conducting material; and
a set of second test structures developed in a second layer disposed adjacent to the first layer, each of the set of second test structures comprising a plurality of second features made of second conducting material; and
generating a voltage-contrast image of the set of second test structures based on the output of the electron beam tool; and
determining connectivity between the set of first test structures and the set of second test structures based on the voltage-contrast image.
65. The medium of clause 64, wherein the method further comprises:
when the voltage-contrast image shows one of the set of second test structures has a low voltage, determining that the second test structure forms a short circuit with one of the set of first test structures.
66. The medium of clauses 64 and 65, wherein the method further comprises:
when the voltage-contrast image shows one of the set of second test structures has a high voltage, determining that the second test structure is in an open circuit with the set of first test structures.
67. The medium of any one of clauses 64 to 66, wherein at least one of the set of first test structures and the set of second test structures is configured to have varying overlay offset values in a first direction along a surface of the substrate.
68. The medium of clause 67, wherein at least one of the set of first test structures and the set of second test structures is configured to have varying overlay offset values in a second direction along the surface of the substrate, the second direction differing from the first direction.
69. The medium of clause 68, wherein the second direction is orthogonal to the first direction.
70. The medium of any one of clauses 67 to 69, wherein the method further comprises:
determining overlay information based on the voltage-contrast image and the overlay offset values.
71. The medium of clause 70, wherein each of the set of first test structures and the set of second test structures has varying critical-dimension values in a second direction that differs from the first direction.
72. The medium of clause 71, wherein the second direction is orthogonal to the first direction.
73. The medium of any one of clauses 10 and 71, wherein the method further comprises:
determining critical-dimension information based on the voltage-contrast image.
74. The medium of any one of clauses 64 to 66, wherein at least one of the set of first test structures and the set of second test structures is configured to have varying critical-dimension values in a first direction along a surface of the substrate.
75. The medium of any one of clause 74, wherein the method further comprises:
determining critical-dimension information based on the voltage-contrast image.
76. The medium of any one of clauses 64 to 75, wherein:
the measurement mark further comprises:
a set of third test structures developed in the first layer, each of the set of third test structures comprising a plurality of third features whose pitch is determined by a sensitivity of the optical metrology tool; and a set of fourth test structures developed in the second layer, each of the set of fourth test structures comprising a plurality of fourth features whose pitch is determined by the sensitivity of the optical metrology tool; and the method further comprises:

receiving an output of the optical metrology tool, wherein the optical metrology tool scans the set of fourth test structures and detects light scattered from the set of fourth test structures, during after developing inspection of the second layer; and determining at least one of overlay information and critical-dimension information based on an output of the optical metrology tool.

77. The medium of clause 76, wherein:

each of the plurality of third periodic features and the plurality of fourth periodic features is further segmented into a plurality of sub-features whose pitch is determined by a sensitivity of an electron beam tool; and the method further comprises:

receiving an output of the electron scanning tool, wherein the electron scanning tool scans the set of fourth test structures and detects electrons scattered by the set of fourth test structures, after etching of the second layer; and determining at least one of overlay information and critical-dimension information based on an output of the electron beam tool.

The embodiments may further be described using the following second set of clauses. References to clauses in this second set of clauses are to clauses in this same set of clauses.

1. A measurement mark comprising:

a set of first test structures developed in a first layer on a substrate, each of the set of first test structures comprising a plurality of first features made of first conducting material; and a set of second test structures developed in a second layer adjacent to the first layer, each of the set of second test structures comprising a plurality of second features made of second conducting material, wherein the measurement mark is configured to indicate connectivity between the set of first test structures and associated second test structures in the set of second test structures when imaged using a voltage-contrast imaging method.

2. The measurement mark of clause 1, wherein the voltage-contrast image shows one of the set of second test structures has a low charge buildup when the second test structure forms a short circuit with one of the set of first test structures.

3. The measurement mark of any one of clauses 1 and 2, wherein the voltage-contrast image shows one of the set of second test structures has a high charge buildup when the second test structure is in an open circuit with the set of first test structures.

4. The measurement mark of any one of clauses 1 to 3, wherein a combination of the set of first test structures and the set of second test structures is configured to convey overlay information in a first direction along a surface of the substrate.

5. The measurement mark of clause 4, wherein at least one of the set of first test structures and the set of second test structures is configured to have varying pitch values in the first direction.

6. The measurement mark of clause 4, wherein a combination of the set of first test structures and the set of second test structures is further configured to convey overlay information in a second direction along a surface of the substrate, the second direction differing from the first direction.

7. The measurement mark of clause 6, wherein the second direction is orthogonal to the first direction.

8. The measurement mark of clause 4, wherein a combination of the set of first test structures and the set of second test structures is further configured to convey critical-dimension information in a second direction along a surface of the substrate, the second direction differing from the first direction.

9. The measurement mark of clause 4, wherein at least one of the set of first test structures and the set of second test structures has varying critical-dimension values in the second direction.

10. The measurement mark of clause 9, wherein the second direction is orthogonal to the first direction.

11. The measurement mark of any one of clauses 1 to 3, wherein a combination of the set of first test structures and the set of second test structures is further configured to convey critical-dimension information in a direction along a surface of the substrate.

12. The measurement mark of clause 11, wherein at least one of the set of first test structures and the set of second test structures is configured to have varying critical-dimension values.

13. The measurement mark of any one of clauses 1 to 12, further comprising:

a set of third test structures developed in the first layer, each of the set of third test structures comprising a plurality of third periodic features whose pitch is determined by a sensitivity of an optical metrology tool; and a set of fourth test structures developed in the second layer, each of the set of fourth test structures comprising a plurality of fourth periodic features whose pitch is determined by the sensitivity of the optical metrology tool.

14. The measurement mark of clause 13, wherein at least one of the set of third test structures and the set of fourth test structures is positioned within a perimeter that corresponds to a field of view of the optical metrology tool.

15. The measurement mark of any one of clauses 13 and 14, wherein the optical metrology tool is configured to perform image-based overlay measurement or diffraction-based overlay measurement.

16. The measurement mark of any one of clauses 13 to 15, wherein each of the plurality of third periodic features and the plurality of fourth periodic features is further segmented into a plurality of sub-features whose pitch is limited by a sensitivity of a particle beam tool.

17. The measurement mark of clause 16, wherein the plurality of sub-features is configured to have varying pitches.

18. The measurement mark of any one of clauses 16 and 17, wherein the plurality of sub-features is configured to have segmentations and pitches in different directions.

19. The measurement mark of any one of clauses 1 to 18, wherein a plurality of the measurement marks are integrated into one multi patterning mark, the plurality of measurement marks is configured to have varying overlay shifts or critical-dimension shifts.

20. The measurement mark of clause 16, wherein the sub-features of the third features are the first periodic features and in which the sub-features of the periodic features are the second periodic features.

21. The measurement mark of clause 14, wherein the plurality of third periodic features and the plurality of fourth periodic features are made of the first conducting material and the second conducting material, respectively.

22. The measurement mark of any one of clauses 1 to 21, wherein each of the first conducting material and the second conducting material comprises semiconductor.

23. The measurement mark of clause 22, wherein the semiconductor comprises at least one of crystalline silicon, polycrystalline silicon, amorphous silicon, and silicon-germanium.

24. The measurement mark of any one of clauses 1 to 21, wherein each of the first conducting material and the second conducting material comprises metal.

25. The measurement mark of clause 24, wherein the metal comprises at least one of copper, tungsten, nickel, cobalt, tantalum, and titanium nitride.

26. A measurement mark comprising:
    a first array of first features at a first pitch and a second array of second features at a second pitch, the first array and the second array being arranged in two consecutive layers on a substrate, wherein the measurement mark is configured for determining an overlay value between the first features relative to associated second features or is configured for determining a critical dimension value of the first features or the second features when imaged using a voltage-contrast imaging method.

27. The measurement mark of clause 26 wherein the first pitch and second pitch are different.

28. The measurement mark of any one of clauses 26 and 27, wherein the first pitch and second pitch vary in one direction or two directions along a surface of the substrate.

29. The measurement mark of any one clauses 26 to 28, wherein at least one of a duty cycle of the first features and a duty cycle of the second features is configured to have varying values.

30. The measurement mark any one clauses 26 to 29, wherein at least one of the first features comprises a sub-array of sub-features.

31. The measurement mark any one clauses 26 to 30, at least one of the first array of first features and the second array of second features is configured to have varying critical dimensions.

32. A system comprising:
    a particle beam tool for scanning a measurement mark and for detecting scattered electrons from the measurement mark; and
    a controller coupled with the particle beam tool and configured to:
        generate a voltage-contrast image from the detected scattered electrons; and
        determine an overlay value and/or critical dimension value from the generated voltage-contrast image.

33. The system of clause 32, wherein the controller is further configured to:
    when the voltage-contrast image shows one of a set of second test structures of the marker has a low charge buildup, determine that the second test structure forms a short circuit with one of a set of first test structures of the marker.

34. The system of any one of clauses 32 and 33, wherein the controller is further configured to:
    when the voltage-contrast image shows one of a set of second test structures of the marker has a high charge buildup, determine that the second test structure is in an open circuit with a set of first test structures of the marker.

35. The system of any one of clauses 33 to 34, wherein the controller is further configured to determine overlay information based on the voltage-contrast image and the overlay offset values.

36. The system of clause 35, wherein the controller is further configured to determine critical-dimension information based on the voltage-contrast image.

37. The system of any one of clauses 32 to 36, further comprising:
    an optical metrology tool for scanning the measurement mark; and
    the controller is further configured to determine at least one of overlay information and critical-dimension information based on the voltage-contrast image and an output of the optical metrology tool.

38. The system of clause 37, wherein the controller is further configured to determine at least one of overlay information and critical-dimension information based on an output of the particle beam tool.

39. The system of any one of clauses 38, wherein the controller is further configured to:
    measure, via the optical metrology tool, the measurement mark to determine overlay offsets of the first and second layers at lithography or after etch;
    measure, via the particle beam tool, the measurement mark to determine connectivity between the first and second layers based on the voltage-contrast image;
    determine critical dimensions and overlay values of masks based on the measurement results by the optical metrology tool and the particle beam tool.

40. A method comprising:
    scanning, by a particle beam tool, a measurement mark and detecting, by the particle beam tool, electrons scattered from the measurement mark, the measurement mark comprising:
        a set of first test structures developed in a first layer adjacent to a substrate, each of the set of first test structures comprising a plurality of first features made of first conducting material; and
        a set of second test structures developed in a second layer disposed adjacent to the first layer, each of the set of second test structures comprising a plurality of second features made of second conducting material; and
    generating, by a controller, a voltage-contrast image of the set of second test structures based on the detected electrons; and
    determining, by the controller, connectivity between the set of first test structures and the set of second test structures based on the voltage-contrast image.

41. The method of clause 40, further comprising:
    when the voltage-contrast image shows one of the set of second test structures has a low charge buildup, determining that the second test structure forms a short circuit with one of the set of first test structures.

42. The method of any one of clauses 40 and 41, further comprising:
    when the voltage-contrast image shows one of the set of second test structures has a high charge buildup, determining that the second test structure is in an open circuit with the set of first test structures.
43. The method of any one of clauses 40 to 42, wherein at least one of the set of first test structures and the set of second test structures is configured to have varying overlay offset values in a first direction along a surface of the substrate.
44. The method of clause 43, wherein at least one of the set of first test structures and the set of second test structures has varying overlay offset values in a second direction along the surface of the substrate, the second direction differing from the first direction.
45. The method of clause 44, wherein the second direction is orthogonal to the first direction.
46. The method of any one of clauses 43 to 45, further comprising:
    determining, by the controller, overlay information based on the voltage-contrast image and the overlay offset values.
47. The method of clause 43, wherein at least one of the set of first test structures and the set of second test structures has varying critical-dimension values in a second direction along the surface of the substrate, the second direction differing from the first direction.
48. The method of clause 47, wherein the second direction is orthogonal to the first direction.
49. The method of any one of clauses 47 and 48, further comprising:
    determining critical-dimension information based on the voltage-contrast image.
50. The method of any one of clauses 40 to 52, wherein at least one of the set of first test structures and the set of second test structures is configured to have varying critical dimensions in a first direction along a surface of the substrate.
51. The method of clause 50, further comprising:
    determining, by the controller, critical-dimension information based on the voltage-contrast image.
52. The method of any one of clauses 40 to 51, wherein:
    the measurement mark further comprises:
        a set of third test structures developed in the first layer, each of the set of third test structures comprising a plurality of third features whose pitch is determined by a sensitivity of the optical metrology tool; and
        a set of fourth test structures developed in the second layer, each of the set of fourth test structures comprising a plurality of fourth features whose pitch is determined by the sensitivity of the optical metrology tool; and
    the method further comprises:
        scanning, by the optical metrology tool, the set of fourth test structures and detect, by the optical metrology tool, light scattered from the set of fourth test structures, during after developing inspection of the second layer; and
        determining, by the controller, at least one of overlay information and critical-dimension information based on an output of the optical metrology tool.
53. The method of clause 52, wherein:
    each of the plurality of third periodic features and the plurality of fourth periodic features is further segmented into a plurality of periodic sub-features whose pitch is determined by a sensitivity of an particle beam tool; and
    the method further comprises:
        scanning, by the electron scanning tool, the set of fourth test structures and detecting, by the particle beam tool, electrons scattered by the set of fourth test structures, after etching of the second layer; and
        determining, by the controller, at least one of overlay information and critical-dimension information based on an output of the particle beam tool.
54. The method of clause 52, wherein the plurality of third periodic features and the plurality of fourth periodic features are made of the first conducting material and the second conducting material, respectively.
55. The method of any one of claims 53 and 54, further comprising
    measuring, via the optical metrology tool, the measurement mark to determine overlay offsets of the first and second layers at lithography or after etch;
    measuring, via the particle beam tool, the measurement mark to determine connectivity between the first and second layers based on the voltage-contrast image;
    determining critical dimensions and overlay values of masks based on the measurement results by the optical metrology tool and the particle beam tool.
56. The method of claim 53, wherein the plurality of sub-features is configured to have varying pitches.
57. The method of any one of claims 53 and 56, wherein the plurality of sub-features is configured to have segmentations and pitches in different directions.
58. The method of any one of clauses 40 to 57, wherein a plurality of the measurement marks are integrated into one multi patterning mark, the plurality of measurement marks is configured to have varying overlay shifts or critical-dimension shifts.
59. A non-transitory computer-readable medium storing a set of instructions that is executable by one or more processors of a device to cause the device to perform a method comprising:
    receiving an output of a particle beam tool, wherein the particle beam tool is configured for scanning a measurement mark and configured for detecting electrons scattered from the measurement mark, the measurement mark comprising:
        a set of first test structures developed in a first layer disposed on a substrate, each of the set of first test structures comprising a plurality of first features made of first conducting material; and
        a set of second test structures developed in a second layer disposed adjacent to the first layer, each of the set of second test structures comprising a plurality of second features made of second conducting material; and
    generating a voltage-contrast image of the set of second test structures based on the output of the particle beam tool; and
    determining connectivity between the set of first test structures and the set of second test structures based on the voltage-contrast image.
60. The medium of clause 59, wherein the set of instructions that is executable by one or more processors of the device to cause the device to further perform:
    when the voltage-contrast image shows one of the set of second test structures has a low charge buildup, determining that the second test structure forms a short circuit with one of the set of first test structures.

61. The medium of clauses 59 and 60, wherein the set of instructions that is executable by one or more processors of the device to cause the device to further perform:
   when the voltage-contrast image shows one of the set of second test structures has a high charge buildup, determining that the second test structure is in an open circuit with the set of first test structures.

62. The medium of any one of clauses 59 to 61, wherein at least one of the set of first test structures and the set of second test structures is configured to have varying overlay offset values in a first direction along a surface of the substrate.

63. The medium of clause 62, wherein at least one of the set of first test structures and the set of second test structures is configured to have varying overlay offset values in a second direction along the surface of the substrate, the second direction differing from the first direction.

64. The medium of clause 63, wherein the second direction is orthogonal to the first direction.

65. The medium of any one of clauses 62 to 64, wherein the set of instructions that is executable by one or more processors of the device to cause the device to further perform:
   determining overlay information based on the voltage-contrast image and the overlay offset values.

66. The medium of clause 65, wherein each of the set of first test structures and the set of second test structures has varying critical-dimension values in a second direction that differs from the first direction.

67. The medium of clause 66, wherein the second direction is orthogonal to the first direction.

68. The medium of any one of clauses 66 and 67, wherein the set of instructions that is executable by one or more processors of the device to cause the device to further perform:
   determining critical-dimension information based on the voltage-contrast image.

69. The medium of any one of clauses 59 to 61, wherein at least one of the set of first test structures and the set of second test structures is configured to have varying critical-dimension values in a first direction along a surface of the substrate.

70. The medium of any one of clause 69, wherein the set of instructions that is executable by one or more processors of the device to cause the device to further perform:
   determining critical-dimension information based on the voltage-contrast image.

71. The medium of any one of clauses 59 to 70, wherein: the measurement mark further comprises:
   a set of third test structures developed in the first layer, each of the set of third test structures comprising a plurality of third features whose pitch is determined by a sensitivity of the optical metrology tool; and
   a set of fourth test structures developed in the second layer, each of the set of fourth test structures comprising a plurality of fourth features whose pitch is determined by the sensitivity of the optical metrology tool; and
   the set of instructions that is executable by one or more processors of the device to cause the device to further perform:
   receiving an output of the optical metrology tool, wherein the optical metrology tool scans the set of fourth test structures and detects light scattered from the set of fourth test structures, during after developing inspection of the second layer; and
   determining at least one of overlay information and critical-dimension information based on an output of the optical metrology tool.

72. The medium of clause 71, wherein:
   each of the plurality of third periodic features and the plurality of fourth periodic features is further segmented into a plurality of sub-features whose pitch is determined by a sensitivity of an particle beam tool; and
   the set of instructions that is executable by one or more processors of the device to cause the device to further perform:
   receiving an output of the electron scanning tool, wherein the electron scanning tool scans the set of fourth test structures and detects electrons scattered by the set of fourth test structures, after etching of the second layer; and
   determining at least one of overlay information and critical-dimension information based on an output of the particle beam tool.

73. The medium of clause 72, wherein the set of instructions that is executable by one or more processors of the device to cause the device to further perform:
   measuring, via the optical metrology tool, the measurement mark to determine overlay offsets of the first and second layers at lithography or after etch;
   measuring, via the particle beam tool, the measurement mark to determine connectivity between the first and second layers based on the voltage-contrast image;
   determining critical dimensions and overlay values of masks based on the measurement results by the optical metrology tool and the particle beam tool.

74. The medium of clause 72, wherein the plurality of sub-features is configured to have varying pitches.

75. The medium of any one of clauses 72 and 74, wherein the plurality of sub-features is configured to have segmentations and pitches at different directions.

76. The medium of any one of clauses 59 to 75, wherein a plurality of the measurement marks are integrated into one multi patterning mark, the plurality of measurement marks is configured to have varying overlay shifts or critical-dimension shifts.

The embodiments may further be described using the following third set of clauses. References to clauses in this third set of clauses are to clauses in this same set of clauses.

1. A measurement mark comprising:
   a set of first test structures developed in a first layer on a substrate, each of the set of first test structures comprising a plurality of first features made of first conducting material; and
   a set of second test structures developed in a second layer adjacent to the first layer, each of the set of second test structures comprising a plurality of second features made of second conducting material,
   wherein the measurement mark is configured to indicate connectivity between the set of first test structures and associated second test structures in the set of second test structures when imaged using a voltage-contrast imaging method.

2. The measurement mark of clause 1, wherein the voltage-contrast image shows a particular test structure of the set of second test structures having a low charge buildup when the particular test structure of the set of second test structures forms a short circuit with a particular test structure of the set of first test structures.

3. The measurement mark of any one of clauses 1 and 2, wherein the voltage-contrast image shows the particular test structure of the set of second test structures having a high charge buildup when the particular test structure of the set of second test structures is in an open circuit with the particular test structure of the set of first test structures.

4. The measurement mark of any one of clauses 1 to 3, wherein a combination of multiple test structures of the set of first test structures and of multiple test structures of the set of second test structures is configured to convey overlay information in a first direction along a surface of the substrate.

5. The measurement mark of clause 4, wherein the multiple test structures of the set of first test structures or the multiple test structures of the set of second test structures are configured to have varying pitch values in the first direction.

6. The measurement mark of clause 4, wherein the combination of the multiple test structures of the set of first test structures and of the multiple test structures of the set of second test structures is further configured to convey overlay information in a second direction along a surface of the substrate, the second direction differing from the first direction.

7. The measurement mark of clause 6, wherein the second direction is orthogonal to the first direction.

8. The measurement mark of clause 4, wherein the combination of the multiple test structures of the set of first test structures and of the multiple test structures of the set of second test structures is further configured to convey critical-dimension information in a second direction along a surface of the substrate, the second direction differing from the first direction.

9. The measurement mark of clause 4, wherein the multiple test structures of the set of first test structures or the multiple test structures of the set of second test structures have varying critical-dimension values in the second direction.

10. The measurement mark of clause 9, wherein the second direction is orthogonal to the first direction.

11. The measurement mark of any one of clauses 1 to 3, wherein a combination of multiple test structures of the set of first test structures and of multiple test structures of the set of second test structures is further configured to convey critical-dimension information in a direction along a surface of the substrate.

12. The measurement mark of clause 11, wherein the multiple test structures of the set of first test structures or the multiple test structures of the set of second test structures are configured to have varying critical-dimension values.

13. The measurement mark of any one of clauses 1 to 12, further comprising:
a set of third test structures developed in the first layer, each of the set of third test structures comprising a plurality of third periodic features having a pitch that is determined by a sensitivity of an optical metrology tool; and
a set of fourth test structures developed in the second layer, each of the set of fourth test structures comprising a plurality of fourth periodic features having a pitch that is determined by the sensitivity of the optical metrology tool.

14. The measurement mark of clause 13, wherein multiple test structures of the set of third test structures or multiple test structures of the set of fourth test structures are positioned within a perimeter that corresponds to a field of view of the optical metrology tool.

15. The measurement mark of any one of clauses 13 and 14, wherein the optical metrology tool is configured to perform image-based overlay measurement or diffraction-based overlay measurement.

16. The measurement mark of any one of clauses 13 to 15, wherein each of the plurality of third periodic features or the plurality of fourth periodic features is further segmented into a plurality of sub-features having a pitch that is limited by a sensitivity of a particle beam tool.

17. The measurement mark of clause 16, wherein the plurality of sub-features is configured to have varying pitches.

18. The measurement mark of any one of clauses 16 and 17, wherein the plurality of sub-features is configured to have segmentations or pitches in different directions.

19. The measurement mark of any one of clauses 1 to 18, wherein a plurality of the measurement marks are integrated into one multi patterning mark, and wherein the plurality of measurement marks is configured to have varying overlay shifts or critical-dimension shifts.

20. The measurement mark of clause 16, wherein the sub-features of the third periodic features are the first periodic features and the sub-features of the fourth periodic features are the second periodic features.

21. The measurement mark of clause 14, wherein the plurality of third periodic features and the plurality of fourth periodic features are made of the first conducting material and the second conducting material, respectively.

22. The measurement mark of any one of clauses 1 to 21, wherein each of the first conducting material and the second conducting material comprises a semiconductor.

23. The measurement mark of clause 22, wherein the semiconductor comprises any of crystalline silicon, polycrystalline silicon, amorphous silicon, or silicon-germanium.

24. The measurement mark of any one of clauses 1 to 21, wherein each of the first conducting material and the second conducting material comprises metal.

25. The measurement mark of clause 24, wherein the metal comprises any of copper, tungsten, nickel, cobalt, tantalum, or titanium nitride.

26. A measurement mark comprising:
a first array of first features at a first pitch and a second array of second features at a second pitch, the first array and the second array being arranged in two consecutive layers on a substrate, wherein the measurement mark is configured to determine an overlay value between the first features relative to associated second features or is configured to determine a critical dimension value of the first features or of the second features when imaged using a voltage-contrast imaging method.

27. The measurement mark of clause 26 wherein the first pitch and the second pitch are different.

28. The measurement mark of any one of clauses 26 and 27, wherein the first pitch and the second pitch vary in one direction or two directions along a surface of the substrate.

29. The measurement mark of any one clauses 26 to 28, wherein a duty cycle of the first features or a duty cycle of the second features is configured to have varying values.

30. The measurement mark of any one clauses 26 to 29, wherein the first features comprise a sub-array of sub-features.

31. The measurement mark of any one clauses 26 to 30, wherein multiple test structures of the first array of first features or multiple test structures of the second array of second features are configured to have varying critical dimensions.

32. A system comprising:
a particle beam tool for scanning a measurement mark and for detecting secondary electrons from the measurement mark; and
a controller coupled with the particle beam tool, the controller including circuitry to:
generate a voltage-contrast image from the detected secondary electrons; and
determine an overlay value or a critical dimension value from the generated voltage-contrast image.

33. The system of clause 32, wherein determining the overlay value or the critical dimension value includes determining the overlay value and the critical dimension value.

34. The system of any one of clauses 32 and 33, wherein the controller includes circuitry to:
when the voltage-contrast image shows a particular test structure of a set of first test structures of the measurement mark has a low charge buildup, determine that the particular test structure of the set of first test structures forms a short circuit with a particular test structure of a set of second test structures of the measurement mark.

35. The system of any one of clauses 32 to 34, wherein the controller includes circuitry to:
when the voltage-contrast image shows the particular test structure of the set of first test structures of the measurement mark has a high charge buildup, determine that the particular test structure of the set of first test structures is in an open circuit with the particular test structure of the set of second test structures of the measurement mark.

36. The system of any one of clauses 32 to 35, wherein the controller includes circuitry to determine overlay information based on the voltage-contrast image or overlay offset values of the measurement mark.

37. The system of clause 36, wherein the controller includes circuitry to determine critical-dimension information based on the voltage-contrast image.

38. The system of any one of clauses 32 to 37, further comprising:
an optical metrology tool for scanning the measurement mark; and
wherein the controller further includes circuitry to determine overlay information or critical-dimension information based on the voltage-contrast image or an output of the optical metrology tool.

39. The system of clause 38, wherein the controller further includes circuitry to:
measure, via the optical metrology tool, the measurement mark to determine overlay offsets of a first layer and a second layer on a substrate, during after-development inspection of a wafer;
measure, via the particle beam tool, the measurement mark to determine connectivity between the first and second layers based on the voltage-contrast image, after etching or polishing of the wafer; and
determine critical dimensions or overlay values of masks on the substrate based on the measurement results by the optical metrology tool or the particle beam tool.

40. The system of clause 39, wherein the controller further includes circuitry to:
determine mask misalignment data based on the overlay value or the critical dimension value; and
send the mask misalignment data to a lithographic apparatus coupled with the controller.

41. The system of any one of clauses 32 to 40, wherein the controller further includes circuitry to:
determine a lithographic process window based on the overlay information or the critical-dimension information.

42. A method comprising:
scanning a set of first test structures of a measurement mark with a charged-particle beam and detecting secondary electrons from the measurement mark;
generating a voltage-contrast image from the detected secondary electrons; and
determining an overlay value or a critical dimension value from the generated voltage-contrast image.

43. The method of clause 42, wherein determining the overlay value or the critical dimension value includes determining the overlay value and the critical dimension value.

44. The method of any one of clauses 42 and 43, further comprising:
when the voltage-contrast image shows a particular test structure of the set of first test structures of the measurement mark having a low charge buildup, determining that the particular test structure of the set of first test structures forms a short circuit with a particular test structure of a set of second test structures of the measurement mark.

45. The method of any one of clauses 42 to 44, further comprising:
when the voltage-contrast image shows the particular test structure of the set of first test structures of the measurement mark having a high charge buildup, determining that the particular test structure of the set of first test structures is in an open circuit with the particular test structure of the set of second test structures of the measurement mark.

46. The method of any one of clauses 42 to 45, further comprising:
determining overlay information based on the voltage-contrast image or overlay offset values of the measurement mark.

47. The method of any one of clauses 42 to 46, further comprising:
determining critical-dimension information based on the voltage-contrast image.

48. The method of any one of clauses 42 to 47, further comprising:
scanning the measurement mark with a light beam and detecting light scattered from the measurement mark;
generating an optical image from the detected scattered light; and
determining overlay information or critical-dimension information based on the voltage-contrast image or the optical image.

49. The method of clause 48, further comprising:
measuring the measurement mark with the light beam to determine, based on the optical image, overlay offsets of a first layer and a second layer on a substrate, during after-development inspection of a wafer;

measuring the measurement mark with the charged-particle beam to determine connectivity between the first and second layers based on the voltage-contrast image, after etching or polishing of the wafer; and determining critical dimensions or overlay values of masks on the substrate based on the measurement results obtained with the light beam or charged-particle beam.

50. The method of any one of clauses 42 to 49, further comprising:

determining mask misalignment data based on the overlay value or the critical dimension value; and adjusting lithographic process parameters based on the mask misalignment data.

51. The method of any one of clauses 42 to 50, further comprising:

determining a lithographic process window based on the overlay information or critical-dimension information.

52. A non-transitory computer-readable medium storing a set of instructions that is executable by one or more processors of a device to cause the device to perform a method comprising:

scanning a set of first test structures of a measurement mark with a charged-particle beam and detecting secondary electrons from the measurement mark;

generating a voltage-contrast image from the detected secondary electrons; and determining an overlay value or a critical dimension value from the generated voltage-contrast image.

53. The medium of clause 52, wherein determining the overlay value or the critical dimension value includes determining the overlay value and the critical dimension value.

54. The medium of any one of clauses 52 and 53, wherein the set of instructions is executable by the one or more processors of the device to cause the device to further perform:

when the voltage-contrast image shows a particular test structure of the set of first test structures of the measurement mark has a low charge buildup, determining that the particular test structure of the set of first test structures forms a short circuit with a particular test structure of a set of second test structures of the measurement mark.

55. The medium of clauses 52 to 54, wherein the set of instructions that is executable by the one or more processors of the device to cause the device to further perform:

when the voltage-contrast image shows the particular test structure of the set of first test structures of the measurement mark has a high charge buildup, determining that the particular test structure of the set of first test structures is in an open circuit with the particular test structure of the set of second test structures of the measurement mark.

56. The medium of any one of clauses 52 to 55, wherein the set of instructions is executable by the one or more processors of the device to cause the device to further perform:

determining overlay information based on the voltage-contrast image or overlay offset values of the measurement mark.

57. The medium of any one of clauses 52 to 56, wherein the set of instructions is executable by the one or more processors of the device to cause the device to further perform:

determining critical-dimension information based on the voltage-contrast image.

58. The medium of any one of clauses 52 to 57, wherein the set of instructions is executable by the one or more processors of the device to cause the device to further perform:

scanning the measurement mark with a light beam and detecting light scattered from the measurement mark;

generating an optical image from the detected scattered light; and determining overlay information or critical-dimension information based on the voltage-contrast image or the optical image.

59. The medium of clause 58, wherein the set of instructions is executable by the one or more processors of the device to cause the device to further perform:

measuring the measurement mark with the light beam to determine, based on the optical image, overlay offsets of a first layer and a second layer on a substrate, during after-development inspection of a wafer;

measuring the measurement mark with the charged-particle beam to determine connectivity between the first and second layers based on the voltage-contrast image, after etching or polishing of the wafer; and determining critical dimensions or overlay values of masks on the substrate based on the measurement results obtained with the light beam or charged-particle beam.

60. The medium of any one of clauses 52 to 59, wherein the set of instructions is executable by the one or more processors of the device to cause the device to further perform:

determining mask misalignment data based on the overlay value or the critical dimension value; and adjusting lithographic process parameters based on the mask misalignment data.

61. The medium of any one of clauses 52 to 60, wherein the set of instructions is executable by the one or more processors of the device to cause the device to further perform:

determining a lithographic process window based on the overlay information or critical-dimension information.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. A measurement mark comprising:
   a set of first test structures formed in a first layer on a substrate, each of the set of first test structures comprising a plurality of first features made of first conducting material; and
   a set of second test structures formed in a second layer adjacent to the first layer, each of the set of second test structures comprising a plurality of second features made of second conducting material,
   wherein the measurement mark is configured to indicate connectivity between the set of first test structures and associated second test structures in the set of second test structures when imaged using a voltage-contrast imaging method, wherein each of the plurality of first features in the set of first test structures is configured, in combination with a corresponding second feature of the set of second test structures, to convey overlay information in a first direction along a surface of the substrate and overlay information in a second direction along a surface of the substrate, the second direction differing from the first direction;

wherein multiple test structures of the set of first test structures or multiple test structures of the set of second test structures are configured to have varying pitch values in the first direction.

2. The measurement mark of claim 1, wherein the voltage-contrast image shows a particular test structure of the set of second test structures having a low charge buildup when the particular test structure of the set of second test structures forms a short circuit with a particular test structure of the set of first test structures.

3. The measurement mark of claim 1, wherein the voltage-contrast image shows a particular test structure of the set of second test structures having a high charge buildup when the particular test structure of the set of second test structures is in an open circuit with the particular test structure of the set of first test structures.

4. The measurement mark of claim 1, wherein a combination of multiple test structures of the set of first test structures and of multiple test structures of the set of second test structures is configured to convey overlay information in the second direction.

5. The measurement mark of claim 4, wherein the second direction is orthogonal to the first direction.

6. The measurement mark of claim 4, further configured to simultaneously measure, based on the voltage-contrast image, an overlay error in the first direction and critical-dimension in the second direction.

7. The measurement mark of claim 1, wherein a combination of multiple test structures of the set of first test structures and of multiple test structures of the set of second test structures is further configured to convey critical-dimension information in the second direction.

8. The measurement mark of claim 1, wherein multiple test structures of the set of first test structures or multiple test structures of the set of second test structures have varying critical-dimension values in the second direction.

9. The measurement mark of claim 8, wherein the second direction is orthogonal to the first direction.

10. The measurement mark of claim 1, wherein a combination of multiple test structures of the set of first test structures and of multiple test structures of the set of second test structures is configured to convey critical-dimension information in a direction along a surface of the substrate.

11. The measurement mark of claim 10, wherein the multiple test structures of the set of first test structures or the multiple test structures of the set of second test structures are configured to have varying critical-dimension values.

12. The measurement mark of claim 1, further comprising:
a set of third test structures formed in the first layer, each of the set of third test structures comprising a plurality of third periodic features having a pitch that is determined by a sensitivity of an optical metrology tool; and
a set of fourth test structures formed in the second layer, each of the set of fourth test structures comprising a plurality of fourth periodic features having a pitch that is determined by the sensitivity of the optical metrology tool.

13. The measurement mark of claim 12, wherein the optical metrology tool comprises a scatterometer.

14. The measurement mark of claim 12, wherein the plurality of third periodic features comprises a two-dimensional array of sub-features having varying pitches in the first and the second direction.

15. The measurement mark of claim 14, wherein the pitches of sub-features in the two-dimensional array in the first and the second direction are configured to be scanned by a charged-particle beam for voltage-contrast imaging.

16. A system comprising:
a particle beam tool for scanning a measurement mark and for detecting secondary electrons from the measurement mark; and
a controller coupled with the particle beam tool, the controller including circuitry to: generate a voltage-contrast image from the detected secondary electrons; and determine an overlay value in a first direction and an overlay value in a second direction from the generated voltage-contrast image, the second direction differing from the first direction,
wherein the measurement mark is configured to indicate connectivity between a set of first test structures and associated second test structures in a set of second test structures based on the generated voltage-contrast image,
each of the set of first test structures comprising a plurality of first features made of first conducting material, and each of the set of second test structures comprising a plurality of second features made of second conducting material, wherein each of the plurality first features in the set of first test structures is configured, in combination with a corresponding second feature of the set of second test structures, to convey overlay information in the first direction and the second direction;
wherein multiple test structures of the set of first test structures or multiple test structures of the set of second test structures are configured to have varying pitch values in the first direction.

17. A method comprising:
scanning a set of first test structures of a measurement mark with a charged-particle beam and detecting secondary electrons from the measurement mark;
generating a voltage-contrast image from the detected secondary electrons; and determining an overlay value in a first direction and an overlay value in a second direction from the generated voltage-contrast image, the second direction differing from the first direction,
wherein the measurement mark is configured to indicate connectivity between the set of first test structures and associated second test structures in a set of second test structures based on the generated voltage-contrast image,
each of the set of first test structures comprising a plurality of first features made of first conducting material, and each of the set of second test structures comprising a plurality of second features made of second conducting material, wherein each of the plurality first features in the set of first test structures is configured, in combination with a corresponding second feature of the set of second test structures, to convey overlay information in the first direction and the second direction;
wherein multiple test structures of the set of first test structures or multiple test structures of the set of second test structures are configured to have varying pitch values in the first direction.

18. The measurement mark of claim 1, wherein multiple test structures of the set of first test structures or multiple test structures of the set of second test structures are configured to have varying overlay offset values in the first direction.

* * * * *